(12) United States Patent
Sogard et al.

(10) Patent No.: US 6,770,987 B1
(45) Date of Patent: Aug. 3, 2004

(54) BRUSHLESS ELECTRIC MOTORS WITH REDUCED STRAY AC MAGNETIC FIELDS

(75) Inventors: Michael R. Sogard, Menlo Park, CA (US); Denis F. Spicer, Bedford (GB); Christopher T. Black, Bedford (GB)

(73) Assignee: Nikon Corporation (JP)

( * ) Notice: Subject to any disclaimer, the term of this patent is extended or adjusted under 35 U.S.C. 154(b) by 278 days.

(21) Appl. No.: 09/625,014

(22) Filed: Jul. 25, 2000

(51) Int. Cl.$^7$ ............................................. H02K 41/00
(52) U.S. Cl. ........................... 310/12; 318/135; 355/53; 355/72
(58) Field of Search .................. 74/490.08, 490.09, 74/490.1; 355/53, 72; 318/135, 574, 625, 687; 310/12

(56) References Cited

U.S. PATENT DOCUMENTS

| | | | |
|---|---|---|---|
| 4,560,911 A | 12/1985 | Chitayat | 318/135 |
| 5,196,745 A * | 3/1993 | Trumper | 310/12 |
| RE34,674 E | 7/1994 | Beakley et al. | 310/12 |
| 5,352,946 A * | 10/1994 | Hoffman et al. | 310/12 |
| 5,545,938 A * | 8/1996 | Mecrow | 310/156.64 |
| 5,617,379 A * | 4/1997 | Shinozaki et al. | 369/13.15 |
| 5,687,141 A * | 11/1997 | Ishii | 369/13.15 |
| 6,072,251 A * | 6/2000 | Markle | 310/12 |
| 6,127,749 A | 10/2000 | Sogard | 310/12 |
| 6,140,729 A * | 10/2000 | Pollock et al. | 310/166 |
| 6,265,793 B1 | 7/2001 | Korenaga | 310/12 |
| 6,305,501 B1 * | 10/2001 | Kahkipuro et al. | 187/289 |
| 6,316,849 B1 | 11/2001 | Konkola et al. | |

OTHER PUBLICATIONS

Magnetic Bearing Stages for Electron Beam Lithography Thesis Document Author: Paul Thomas Konkola, Feb. 1998, Massachusetts Institute of Technology.

Magnetic Bearing Stages for Electron Beam Lithography, Author: Paul Thomas Konkola and David L. Trumper, As noted on pp. 2–7: Submitted to the 8$^{th}$ International Symposium on Magnetic Bearings, Mito, Japan, Aug. 26–28, 2002. This paper is available over the Internet: http://web.mit.edu/konkola/www/pubs/ismb02_ptk.pdf.

* cited by examiner

*Primary Examiner*—Thanh Lam
*Assistant Examiner*—Judson H. Jones
(74) *Attorney, Agent, or Firm*—Steven G. Roeder; Jim Rose

(57) ABSTRACT

A linear brushless electric motor (10) including a magnet component (12), a conductor component (14) that interacts with the magnet component (12) and a control system (15) for directing current to the conductor component (14) is provided herein. Uniquely, the conductor component (14) includes an auxiliary conductor array (42) that reduces stray magnetic fields generated by the electric motor (10), without significantly influencing the dynamic performance of the motor (10) and without significantly increasing the size of the motor (10). Because of the conductor component (14) provided herein, the motor (10) is particularly useful in manufacturing, measurement and/or inspection processes that are sensitive and/or influenced by stray AC magnetic fields. More specifically, the present invention is particularly useful with an exposure apparatus (18) that utilizes an illumination system (24) that generates a charged particle beam, such as an electron beam.

75 Claims, 14 Drawing Sheets

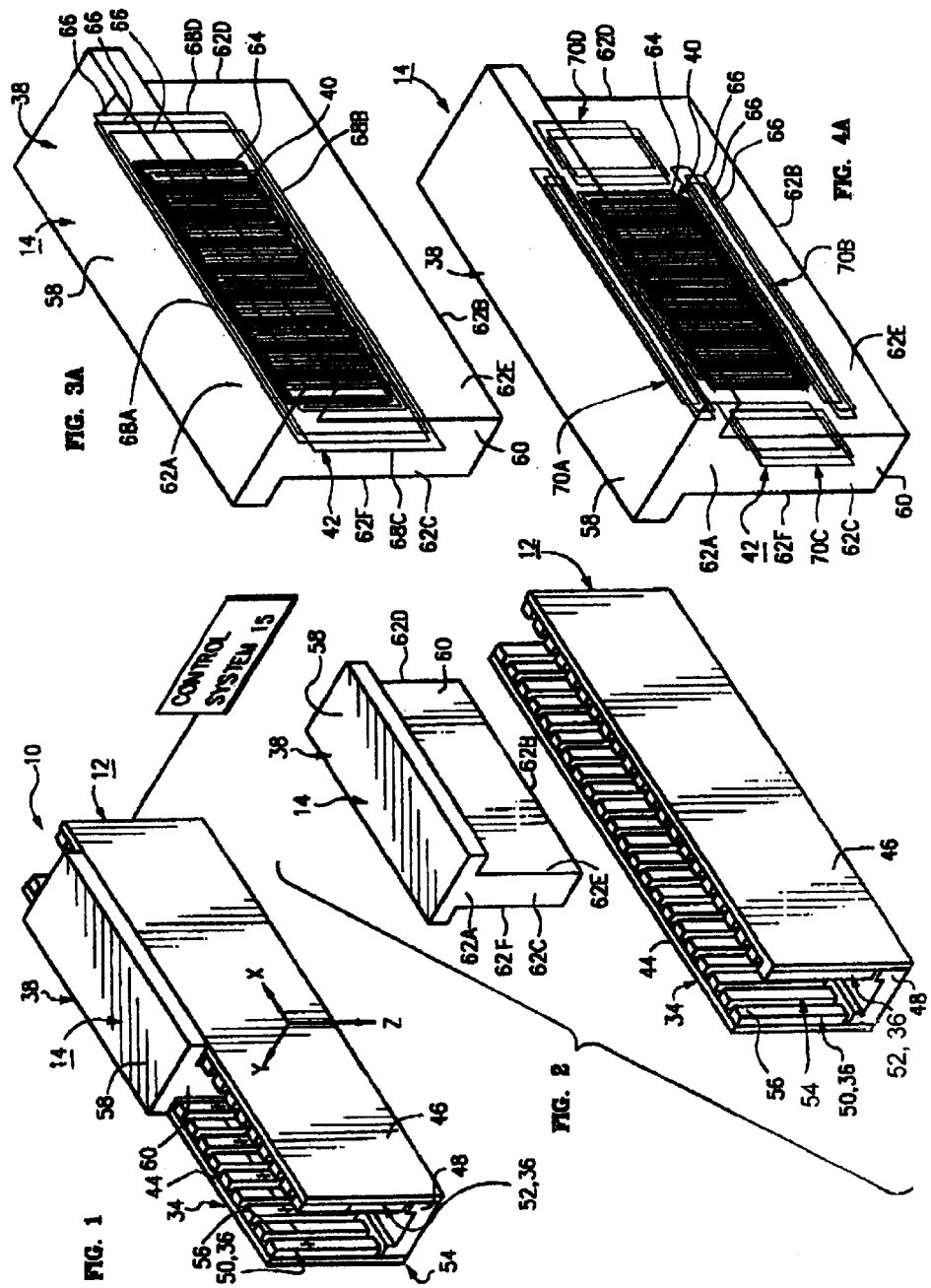

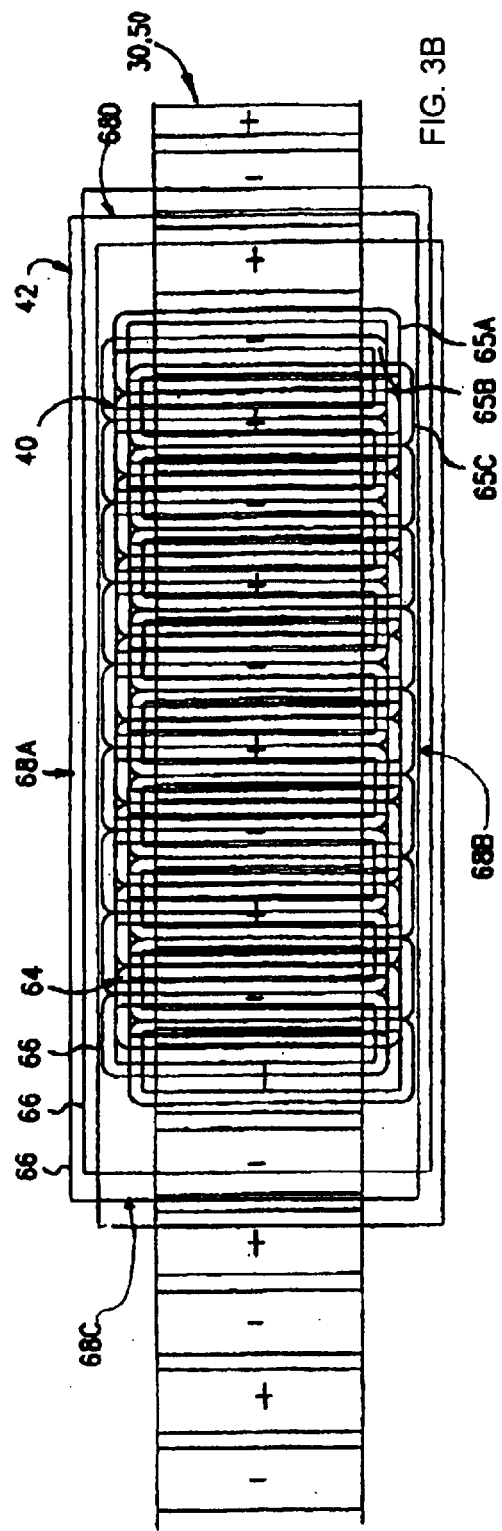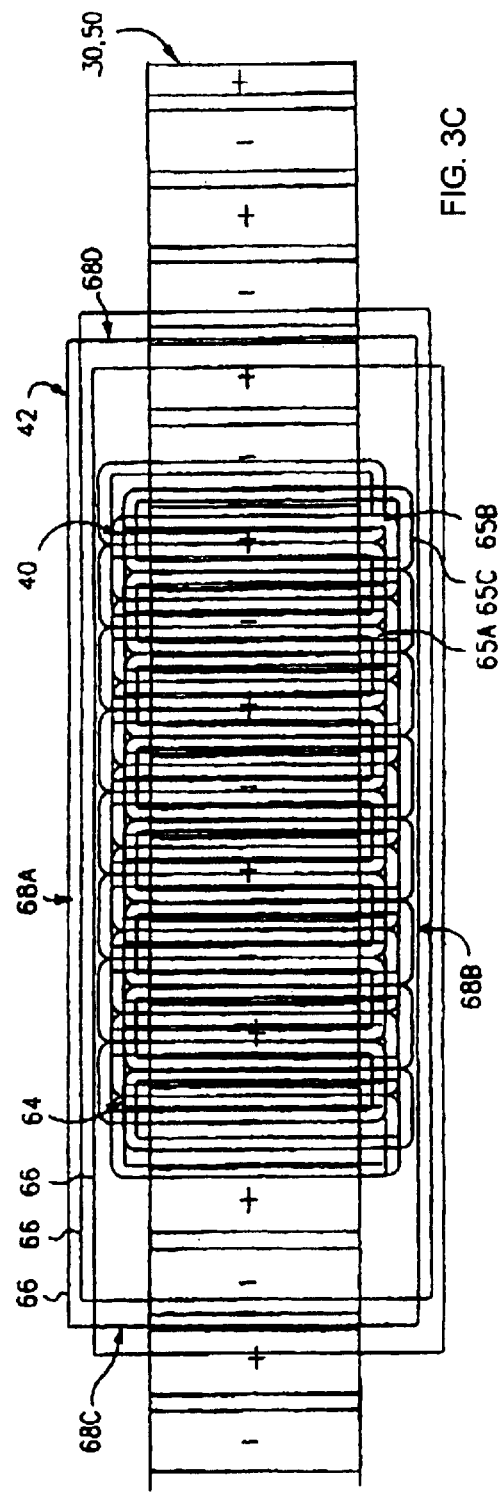

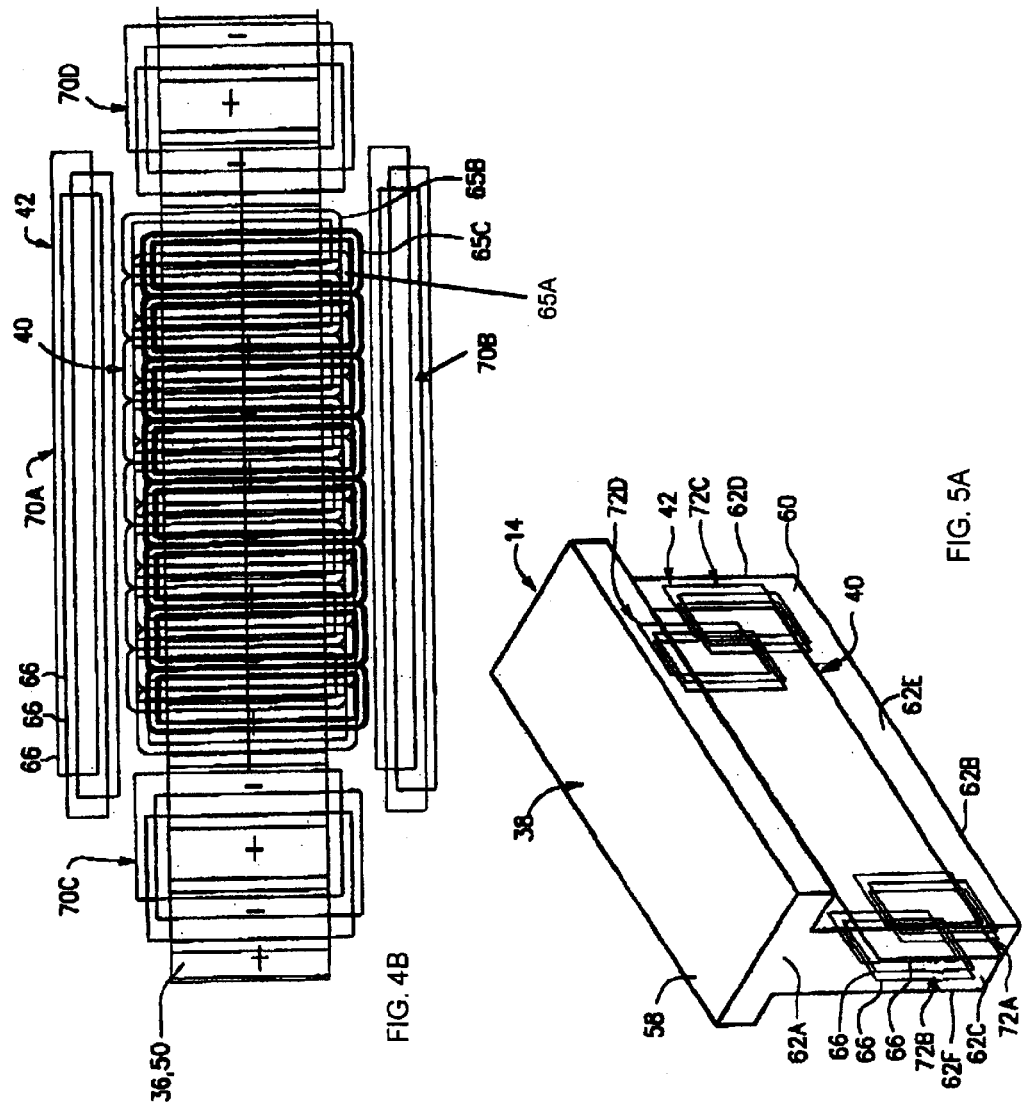

US 6,770,987 B1

BRUSHLESS ELECTRIC MOTORS WITH REDUCED STRAY AC MAGNETIC FIELDS

FIELD OF THE INVENTION

The present invention is directed to brushless electric motors. More specifically, the present invention is directed to device and method for reducing stray AC magnetic fields generated by linear brushless electric motors. The linear brushless electric motors are particularly useful for moving stages in charged particle lithography, inspection and/or measurement tools.

BACKGROUND

Linear motors are used in a variety of electrical devices. For example, photolithography systems and other semiconductor processing equipment utilize linear motors to precisely position a reticle stage holding a reticle and a wafer stage holding a wafer. Alternately, linear motors are used in other devices, including elevators, machine tools, metal cutting machines, and inspection machines.

A typical brushless electric motor includes a magnet component and a conductor component. The magnet component includes a plurality of permanent magnets positioned side-by-side each of which generates a surrounding magnetic field. The conductor component includes a plurality of motor drive coils. When electric current flows in the motor drive coils, a Lorentz type force is created in a direction mutually perpendicular to the direction of the motor drive coils and the magnetic field of the magnets. The force can be used to move one of the components relative to the other component of the motor.

During operation, a typical brushless linear electric motor generates stray magnetic fields external to the motor. Unfortunately, a number of manufacturing, measurement and/or inspection processes are influenced by stray AC or more generally time dependant magnetic fields. For example, electron beams are influenced by AC magnetic fields of sufficient magnitude. Thus, with current motor designs, AC brushless linear electric motors must be positioned a relatively large distance away from an electron beam, typically outside a system magnetic shield.

Recently, requirements of higher performance require the electric motors be integrated directly into the stages. This means the motors must be positioned within the magnetic shield and close to the electron beam. As a result thereof, the stray AC magnetic fields from the motors present a problem.

One attempt to solve this problem includes adding one or more additional magnetic shields that block the stray AC magnetic fields from the motor. Unfortunately, the magnetic shields will require a sizable opening to allow for movement of the moving part of the motor. Further, the magnetic shields can increase the size of the motor. This increases the size and weight of the entire tool.

In light of the above, it is an object of the present invention to provide a brushless electric motor that has reduced stray magnetic fields. Another object is to provide a brushless electric motor for an exposure apparatus that utilizes a charged particle beam. Yet another object is to provide an improved motor for precisely positioning a device during a manufacturing, measurement and/or an inspection process. Still another object of the present invention is to provide a method for decreasing stray magnetic fields without significantly influencing the dynamic performance of the motor and without significantly increasing the size of the motor. Yet another object of the present invention is to provide a conductor component for an electric motor that reduces the stray magnetic fields of the motor. Another object is to provide an exposure apparatus capable of manufacturing precision devices, such as high density, semiconductor wafers.

SUMMARY

The present invention is directed to an electric motor and a conductor component that satisfies these objects. The electric motor includes a magnet component and a control system in addition to the conductor component The magnet component includes one or more magnets that generate surrounding magnetic fields. The conductor component includes a motor drive conductor array that interacts with the magnet component to move one of the components relative to the other component of the electric motor. More specifically, the control system directs electric current to the motor drive conductor array. When electric current flows in the motor drive conductor array, a reaction force is generated that is used to move one of the components relative to the other component of the electric motor.

Uniquely, the conductor component also includes an auxiliary conductor array. As provided herein, when current is directed through the auxiliary conductor array, the auxiliary conductor array generates an auxiliary electro-magnetic field that interacts with a stray magnetic field of the motor and reduces the stray magnetic field of the motor. As a result of this design, the magnitude of the stray magnetic field of the brushless electric motor is reduced. Thus, the motor provided herein is particularly useful in manufacturing, measurement and/or inspection processes that are sensitive to and/or influenced by stray AC magnetic fields.

In a preferred embodiment, the auxiliary conductor array includes one or more auxiliary coils that are (i) positioned near the motor drive conductor array, (ii) positioned to have substantially no effect on the performance of the motor, and (iii) designed to not significantly influence the size and thickness of the conductor component.

In one embodiment, the auxiliary conductor array substantially encircles the motor drive conductor array. In this embodiment, the auxiliary conductor array includes a left transverse segment and a right transverse segment that is spaced apart from the left transverse segment along the direction of motor travel. Importantly, the transverse segments are positioned so when current is directed through the auxiliary conductor array, the left transverse segment, generates a force that is substantially equal and opposite to a force generated by the right transverse segment. With this design, the auxiliary conductor array does not significantly influence the performance of the motor.

Alternately, in another embodiment, the auxiliary conductor array includes four spaced apart coil sets that cooperate to substantially encircle the motor drive conductor array in its plane. This design is particularly useful when the motor drive conductor array includes an even number of motor drive coils.

Additionally, in the designs provided herein, the conductor component includes a conductor component housing that retains the motor drive conductor array and the auxiliary conductor array.

In the designs provided herein, the magnet component includes a pair of spaced apart magnet arrays and the motor drive conductor array is positioned between the magnet arrays. Further, the auxiliary conductor array is positioned between the magnet arrays.

The present invention is also directed to a method for manufacturing a brushless electric motor, a stage assembly, an exposure apparatus and a method for making a device utilizing the exposure apparatus.

BRIEF DESCRIPTION OF THE DRAWINGS

The novel features of this invention, as well as the invention itself, both as to its structure and its operation, will be best understood from the accompanying drawings, taken in conjunction with the accompanying description, in which similar reference characters refer to similar parts, and in which:

FIG. 1 is a perspective view of a linear brushless type electric motor having features of the present invention;

FIG. 2 is an exploded, perspective view of the linear motor of FIG. 1;

FIG. 3A is a perspective view of a first embodiment of a conductor component having features of the present invention, including a motor drive conductor array and an auxiliary conductor array;

FIG. 3B is a side view of the motor drive conductor array and the auxiliary conductor array of FIG. 3A positioned in front of a portion of a first magnet array;

FIG. 3C is a side view of a variation of the motor drive conductor array and the auxiliary conductor array of FIG. 3A positioned in front of a portion of the first magnet array;

FIG. 4A is a perspective view of a second embodiment of a conductor component having features of the present invention, including a motor drive conductor array and an auxiliary array;

FIG. 4B is a side view of the motor drive conductor array and the auxiliary conductor array of FIG. 4A positioned in front of a portion of the first magnet array;

FIG. 5A is a perspective view of a third embodiment of a conductor component having features of the present invention, including a motor drive conductor array and an auxiliary array;

DESCRIPTION

FIGS. 1 and 2 illustrate a linear brushless electric motor 10 having features of the present invention. The electric motor 10 includes a magnet component 12, a conductor component 14 that interacts with the magnet component 12 and a control system 15 for directing current to the conductor component 14. The conductor component 14 is uniquely designed to reduce the magnitude of stray magnetic fields generated by the electric motor 10, without significantly influencing the dynamic performance of the motor 10 and without significantly increasing the size of the motor 10. For an AC motor, the conductor component 14 is designed to reduce the magnitude of the stray AC magnetic fields generated by the AC motor.

Figure 17:
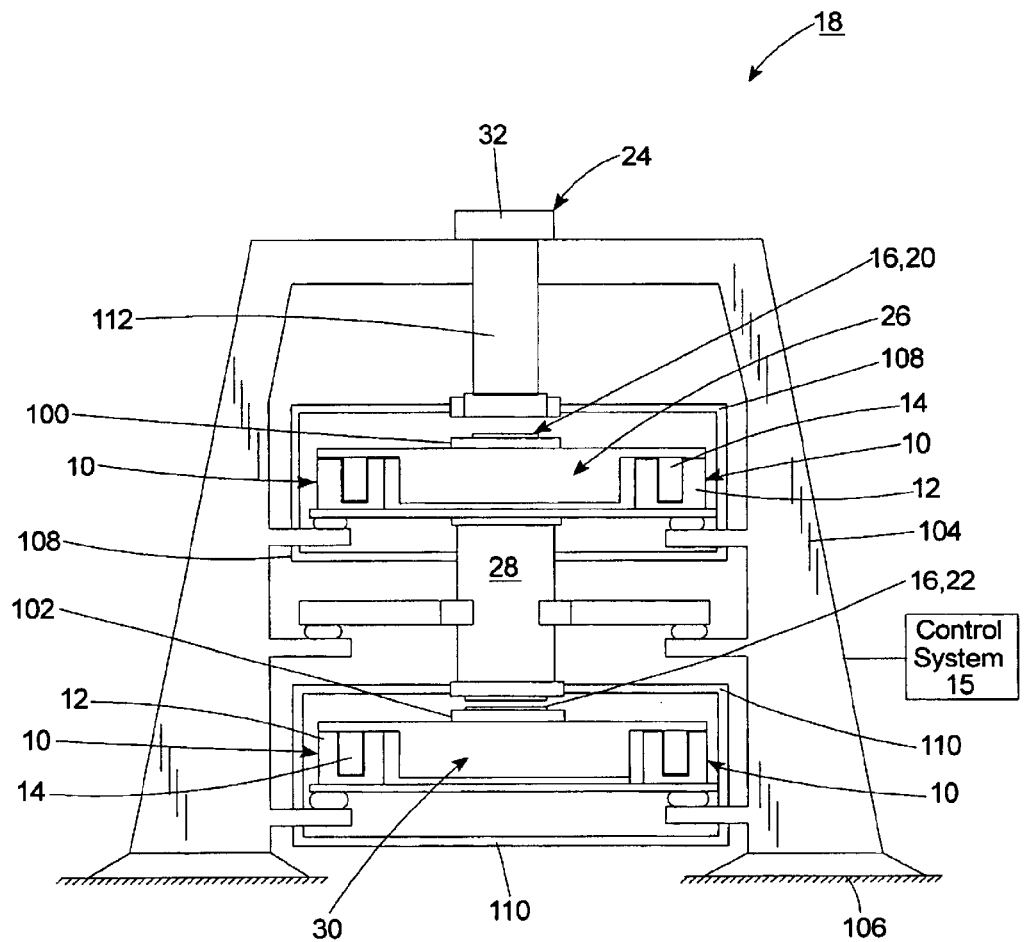
FIG. 17 is a side illustration of an exposure apparatus utilizing a plurality of motors having features of the present invention.

The motor 10 is particularly useful for precisely positioning a device 16 (illustrated in FIG. 17) during a manufacturing, measurement and/or an inspection process. The type of device 16 positioned and moved by the motor 10 can be varied. For example, as illustrated in FIG. 17, multiple motors 10 can be used in an exposure apparatus 18 for precisely positioning a reticle 20 and a semiconductor wafer 22 during manufacturing of the semiconductor wafer 22. Alternately, for example, one or more motors 10 can be used to move other types of devices during manufacturing, measurement and/or inspection.

Because of the conductor component 14 provided herein, the motor 10 is particularly useful in manufacturing, measurement and/or inspection processes that are sensitive to and/or influenced by stray AC magnetic fields. As illustrated in FIG. 17, a typical charged particle exposure apparatus 18 includes an illumination system 24, a reticle stage assembly 26, an optical assembly 28 and a wafer stage assembly 30. The illumination system 24 includes an illumination source 32 (illustrated in FIG. 17) that generates a beam of charged particles (not shown). One type of illumination source 32 is an electron beam generator that generates an electron beam. An electron beam can be influenced by AC magnetic fields of sufficient magnitude. Thus, minimizing the stray AC magnetic fields is an important consideration in an electron beam lithography, inspection, or metrology system.

It should be understood that DC magnetic fields, below some maximum intensity, do not perturb a charged particle beam in operation. The effects of the DC magnetic field of the charged particle beam can be corrected or compensated for during the initial alignment procedure for the beam prior to operation. Only if the DC magnetic field is so strong that the initial alignment procedure is affected does it become a problem. Typically, the tolerable DC magnetic field can exceed the tolerable AC magnetic field by several orders of magnitude.

As provided herein, the motor 10 effectively does not generate magnetic fields that perturb an electron beam. Thus, with the present design, one or more brushless linear motors 10 could be placed closer to the electron beam. Because, the one or more motors 10 can be placed closer to the electron beam, the motors can be integrated into one or both of the stage assemblies 26, 30 and the size of the stage assemblies 26, 30 can be reduced. As a result thereof, smaller motors 10 can be used and the motors 10 can more accurately position the device 16. Further, the exposure apparatus 18 is capable of manufacturing higher precision devices 16, such as higher density, semiconductor wafers 22.

Figure 6B:
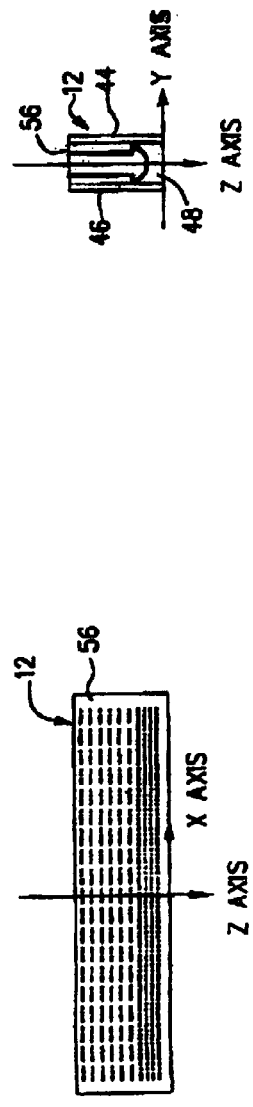
FIG. 6B is an end plan view of the magnetic component.
Figure 6A:
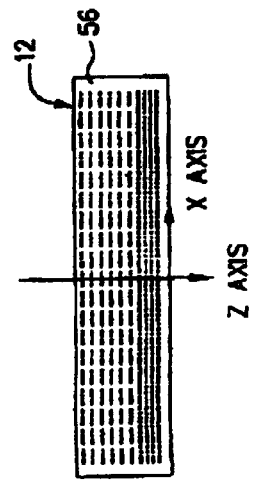
FIG. 6A is a side plan view of the magnetic component.

FIGS. 1, 6A and 6B include a coordinate system that designates an X axis, a Y axis, and a Z axis. It should be understood that the coordinate system is merely for reference and can be varied. For example, the X axis can be switched with the Y axis and/or the motor 10 can be rotated. Additionally, some of the Figures include the symbol "+" that represents the North pole and the symbol "−" that represents the South pole of a permanent magnet.

FIG. 1 illustrates a perspective view of the motor 10 and FIG. 2 illustrates an exploded perspective view of the motor 10. In this embodiment, the conductor component 14 is designed to move relative to magnet component 12. Alternately, for example, the motor could be designed so that the magnet component moves relative to the conductor component.

The magnet component 12 includes a magnet component housing 34 and one or more magnet arrays 36, and the conductor component 14 includes a conductor component housing 38, one or more motor drive conductor arrays 40 and one or more auxiliary conductor arrays 42.

The design of the magnet component housing 34 can be varied to suit the design requirements of the motor 10. In the embodiment illustrated in the Figures, the magnet component housing 34 is somewhat "U" shaped and includes a first wall 44, a second wall 46 and a separator 48 that are secured together. Each of the walls 44, 46 is generally planar shaped. The separator 48 maintains the first wall 44 spaced apart from the second wall 46. Preferably, the magnet component housing 34 and the separator 48 are made of a magnetically permeable material, such as iron. The magnetically permeable material provides some shielding of the magnetic fields generated by the motor 10, as well as providing a low reluctance magnetic flux return path for the magnets.

The number of magnet arrays 36 in the motor 10 can be varied. For example, in the embodiment illustrated in the Figures, the motor 10 includes a first magnet array 50 and a second magnet array 52. The first magnet array 50 is secured to the first wall 44 and the second magnet array 52 is secured to the second wall 46. The first magnet array 50 and the second magnet array 52 are spaced apart by a magnet gap 54. Alternately, for example, the motor could be designed with a single magnet array.

Each of the magnet arrays 36 includes one or more magnets 56. The design, the positioning, and the number of magnets 56 in each magnet array 36 can be varied to suit the design requirements of the motor 10. In the embodiment illustrated in FIGS. 1 and 2, each magnet array 36 includes twenty-two (22), rectangular shaped magnets 56 that are aligned side-by-side linearly along the respective wall 44, 46. The magnets 56 in each magnet array 36 are orientated so that the poles alternate between the North pole and the South pole. Stated another way, the magnets 56 in each magnet array 36 are preferably arranged with alternating magnetic polarities. The magnets 56 are spaced periodically. The repeat distance Is referred to as the magnet pitch.

Further, the polarities of opposed magnets 56 in the two magnet arrays 50, 52 are opposite. This leads to strong magnetic fields in the magnet gap 54 and strong force generation of the motor 10. Stated another way, this leads to strong magnetic fields in the region of the motor drive conductor array 40.

Each of the magnets 56 generates a surrounding magnetic field of preferably equal magnitude. Further, each of the magnets 56 is preferably made of a high energy product, rare earth, permanent magnetic material such as NdFeB. Alternately, for example, each magnet can be made of a low energy product, ceramic or other type of material that is surrounded by a magnetic field.

The design of the conductor component housing 38 can be varied to suit the design requirements of the motor 10. In the embodiment illustrated in the Figures, the conductor component housing 38 is somewhat "T" shaped and includes an attachment section 58 and a conductor section 60. The attachment section 58 extends across the magnet component 12 and can be used to secure the conductor component 14 to the object to be moved by the motor 10. The conductor section 60 preferably retains the motor drive conductor array 40 and the auxiliary conductor array 42. In the embodiment illustrated in the Figures, the conductor section 60 moves along the magnet gap 54 between the magnet arrays 50, 52.

Alternatively, the object to be moved by the motor 10 could be attached to the magnet component 12, and the conductor component 14 could be attached to an unmoving structure. While the present invention would continue to function successfully, by significantly reducing the AC magnetic field from the conductor component 14, the moving magnet component 12 would generate an effectively time varying magnetic field from the moving magnets which could perturb a charged particle beam. The embodiments illustrated herein are not as successful in correcting the varying magnetic field from the moving magnets. However, with the teachings provided herein, one or more auxiliary conductor arrays could be added to the motor 10 that move with the moving magnets and reduce the magnetic field from the moving magnets.

In the embodiment illustrated in FIGS. 1 and 2, each of the sections 58, 60 is generally rectangular shaped. Further, in the embodiment illustrated in FIGS. 1 and 2, the attachment section 58 extends substantially horizontally along the X axis and the conductor section 60 extends vertically downward along the Z axis from the attachment section 58, substantially perpendicular to the attachment section 58. The conductor section 60 includes (i) an upper, longitudinal edge 62A, (ii) a lower, longitudinal edge 62B spaced apart from the upper, longitudinal edge 62A, (iii) a left transverse edge 62C, and (iv) a right transverse edge 62D spaced apart from the left transverse edge 62C, (v) a front side 62E, and (vi) a rear side 62F opposed from the front side 62E. If the motor 10 is used in a charged particle exposure apparatus as described earlier, it will likely operate within a vacuum environment required by the charged particle beam. In that event, the motor 10 must be vacuum compatible, and it must be constructed and assembled using vacuum compatible materials and procedures.

The present invention provides a number of alternative embodiments of the conductor component 14. As an overview, FIG. 3A illustrates a perspective view of a first embodiment of the conductor component 14, FIG. 3C illustrates a variation of the first embodiment of the conductor component 14, FIG. 4A illustrates a perspective view of a second embodiment of the conductor component 14, and FIG. 5A illustrates a perspective view of a third embodiment of the conductor component 14. Uniquely, in each embodiment, the auxiliary conductor array 42 reduces the strength of stray magnetic fields from the electrically excited motor drive conductor array 40.

The design and number of motor drive conductor arrays 40 in the conductor component 14 can be varied. For example, in each of the embodiments illustrated herein, the conductor component 14 includes a single motor drive conductor array 40 that is embedded into the conductor section 60 of the conductor component 14. In this design, the conductor section 60 is positioned within the magnet gap 54 between the magnet arrays 50, 52 and the motor drive conductor array 40 is immersed in the magnetic fields of the magnets 56. Alternately, for example, the conductor component could include a pair of motor drive conductor arrays that are positioned on opposite sides of a single magnet array.

The motor drive conductor array 40 preferably includes one or more motor drive coils 64 or other type of conductor. In the embodiments illustrated in the Figures, the motor drive conductor array 40 is for a three phase AC motor 10 and includes a first set 65A of drive coils, a second set 65B of drive coils and a third set 65C of drive coils. Stated another way, each phase includes a plurality of electrical wires that are wrapped into a plurality of motor drive coils 64 that extends linearly within the conductor section 60 of the conductor component 14. The drive coil sets 65A, 65B, and 65C are staggered in the direction of linear motion. More specifically, the second coil set 65B is spaced a distance $(n+\frac{1}{3})p$ from the first coil set 65A, and the third coil set 65C is spaced apart a distance $(n+\frac{2}{3})p$ from first coil set 65A. In this equation, "p" is the magnet pitch and "n" is an integer. Normally, n is equal to zero (n=0). The electrical wires can be made of metal such as copper or any substance or material capable of carrying electrical current.

The number of motor drive coils 64 in each set 65A, 65B, 65C can be varied. In the embodiment illustrated in FIGS. 3A and 3B, each phase includes a plurality of electrical wires that are wrapped into an assembly of nine motor drive coils 64. These motor drive coils 64 are periodic with a periodicity equal to the magnet pitch. They are wired in series. They are also referred to as electric poles, or poles. Alternately, in the embodiment illustrated in FIGS. 3C, 4A, 4B, 5A and 5B, each phase includes a plurality of electrical wires that are wrapped into eight motor drive coils 64. It should be noted that the motor drive coils 64 are illustrated in the Figures as being offset vertically for clarity. In use, the motor drive coils 64 are preferably not vertically offset.

The control system 15 directs and controls the electrical current to the motor drive coils 64 In the motor drive conductor array 40. More specifically, the control system 15 independently directs current to each set 65A, 65B, 65C of motor drive coils 64. The electrical current in the motor drive conductor array 40 interacts with the magnetic fields that surround the magnets 56 in the magnet arrays 50, 52. When electric current flows in the wires of the motor drive coils 64, a Lorentz type force is generated in a direction mutually perpendicular to the direction of the wires of the motor drive coils 64 and the magnetic field of the magnets 56. If the current magnitudes and polarity are adjusted properly to the alternating polarity of the magnet fields of the magnets 56, based on the relative position of the motor drive conductor array 40, a controllable net force on the motor drive coils 64 is generated. This force can be used to move one of the components 12, 14 relative to the other component 14, 12. In the embodiment illustrated in the Figures, the conductor component 14 moves relative to the fixed magnet component 12.

Additionally, when electrical current flows in the motor drive coils 64, a stray magnetic field external to the motor 10 is generated.

The design of the auxiliary conductor array 42 can be varied according to the design of the motor 10 and the design of the motor drive conductor array 40. A number of alternate embodiments of the auxiliary conductor array 42 are illustrated herein. In each embodiment, the auxiliary conductor array 42 reduces the magnitude and/or strength of stray magnetic fields from the electrically excited motor drive conductor array 40. Stated another way, the electrically excited auxiliary conductor array 42 generates an auxiliary magnetic field that cancels and or reduces the stray magnetic field generated by the electrically excited motor drive coils 64. The embodiments provided herein illustrate only a couple of possible auxiliary conductor arrays 42. Those skilled in the art will recognize that other designs and locations of the auxiliary conductor array are possible.

The auxiliary conductor array 42 includes one or more auxiliary coils 66 or other type of conductor. Each auxiliary coil 66 typically includes a plurality of electrical wires that are made of metal such as copper or any substance or material capable of carrying electrical current. In a preferred embodiment, the one or more auxiliary coils 66 are (i) integrated into the conductor section 60, near the motor drive conductor array 40, (ii) sized and positioned to have substantially no effect on the performance of the motor 10, and (iii) positioned within the thickness of the conductor section 60 so the magnet gap 54 can be kept as small as possible.

In each of the embodiments illustrated herein, the auxiliary conductor array 42 is embedded into the conductor section 60 of the conductor component 14. Also, the auxiliary conductor array 42 is positioned within the magnet gap 54 between the magnet arrays 50, 52 and is immersed in the magnetic fields of the magnets 56. Alternately, all or a portion of the auxiliary conductor array may be positioned outside the magnet gap 54 and/or all or a portion of the auxiliary conductor array may be secured to another part of the mover other than the conductor section 60 of the conductor component 14. However, the performance of the externally mounted auxiliary conductor array may not be as good.

FIGS. 3A and 3B illustrate a first embodiment of the auxiliary conductor array 42. More specifically, FIG. 3A illustrates a perspective view of a first embodiment of the auxiliary conductor array 42 in the conductor component 14, and FIG. 3B illustrates a side view of the auxiliary conductor array 42 positioned in front of a portion of the first magnet array 50. In this embodiment, the auxiliary conductor array 42 includes three, spaced apart auxiliary coils 66. Each of the auxiliary coils 66 is positioned to cancel the stray magnetic field generated by one of the phases of the motor drive conductor array 40. Further, each of the auxiliary coils 66 encircles the motor drive conductor array 40 along its plane and extends along the perimeter of the conductor section 60 of the conductor component housing 38. More specifically, each of the auxiliary coils 66 includes (i) an upper longitudinal segment 68A extending parallel to the upper longitudinal edge 62A of the conductor section 60, (ii) a lower longitudinal segment 68B extending parallel to the lower longitudinal edge 62B of the conductor section 60, (iii) a left transverse segment 68C extending parallel to the left transverse edge 62C of the conductor section 60, and (iv) a right transverse segment 68D extending parallel to the right transverse edge 62D of the conductor section 60. The auxiliary coils 66 are staggered similar to the drive coil sets and spaced apart along the conductor component housing 38 to cancel the stray magnetic field generated by each of the phases of the motor drive conductor array 40. It should be noted that the auxiliary coils 66 are illustrated in the Figures as being offset vertically for clarity. In use, the auxiliary coils 66 are preferably not vertically offset In the embodiment illustrated in FIGS. 3A and 3B, each phase of the motor drive conductor array 40 includes nine motor drive coils 64, an odd number of electric poles. The magnetic field from a pole of each motor drive coil 64 is believed to approximate that from a magnetic dipole at significantly large distances from the conductor component 14. Therefore, it is expected that the intensity of the magnetic field will be proportional to the magnetic dipole moment $m_p$:

$$m_p = \text{pole loop area} \times NI \qquad \text{(Equation 1)}$$

where NI is the number of current turns in the motor drive coil 64. N is the number of turns of wire in the motor drive coil 64.

The geometry of each motor drive coil 64 is not believed to be important. Instead, the loop area and the location of each motor drive coil 64 is considered to be the determining factor. The same thing is true for the auxiliary coil 66. Because the pole fields of the motor drive coils 64 alternate in polarity similar to the alternating magnetic field directions from the magnets 56, significant cancellation of the magnetic field of the motor drive coils 64 should take place. As provided herein, beyond some distance from the motor, the total stray magnetic field from the electrically excited motor drive conductor array 40 should be approximately proportional to:

$$m_{motor\ drive\ conductor\ array} = \sum_{i=1}^{no.\ poles} m_{pi} \approx m_p. \quad \text{(Equation 2)}$$

The auxiliary field generated by the electrically excited auxiliary conductor array 42 should be proportional to:

$$m_{auxiliary\ conductor\ array} = (2np)L_c N_c I_c, \quad \text{(Equation 3)}$$

In this formula, n is an integer, p is the magnet pitch, $L_c$ is the width if the auxiliary coil transverse to the direction of motion, $N_c I_c$ is the number of current turns in the auxiliary coil, and $N_c$ is the number of turns of wire in the auxiliary coil 66. The following formula applies when the stray magnetic field from the electrically excited motor drive coils 64 is approximately nullified by the auxiliary magnetic field from the electrically excited auxiliary conductor array 42:

$$m_{auxiliary\ conductor\ array} \approx m_{motor\ drive\ conductor\ array} \approx m_p, \quad \text{(Equation 4)}$$

or $$2npL_c N_c I_c \approx \text{coil loop area} \times NI. \quad \text{(Equation 5)}$$

Therefore $$N_c I_c \approx (\text{coil loop area}/2npL_c)NI. \quad \text{(Equation 6)}$$

In the embodiment illustrated in FIGS. 3A and 3B the motor drive conductor array 40 includes nine individual motor drive coils 64 or poles. The three phases of the motor drive conductor array 40 increase the total length of the coils in the motor drive conductor array 40 to be approximately ten (10) pitch units and the mechanical structure of the motor drive conductor array 40 increases its length an additional amount. Therefore the auxiliary coils 66 are required to have a minimum of 12 pitch units long. Hence n is equal to six (6).

However, in the embodiments illustrated herein, the auxiliary conductor array 42 is mounted near the motor drive conductor array 40. By mounting the a auxiliary conductor array 42 on the conductor component 14 near the motor drive conductor array 40, the length of the auxiliary conductor array 42 can also be approximately ten (10) pitch units.

In the embodiment illustrated in FIG. 3B, the left transverse segment 68C and the right transverse segment 68D of each of the auxiliary coils 66 is always positioned to lie in the magnetic fields of the same polarity of the magnet arrays 36. Thus, the currents running through the left transverse segment 68C and the right transverse segment 68D of the auxiliary coils 66 produce approximately equal and opposite forces, assuming the magnet fields of the magnets 56 are approximately equal. As a result thereof, the magnetic reaction force generated by the auxiliary conductor array 42 on the motor 10 is always approximately zero.

The control system 15 controls current to the auxiliary conductor array 42 to reduce and/or effectively cancel the stray magnetic fields generated by the motor 10. More specifically, current through the auxiliary coils 66 generates an auxiliary magnetic field opposed to the stray magnetic field generated by the electrically excited motor drive coils 64. The control system 15 adjusts the amount of current to the auxiliary conductor array 42 to counteract the stray magnetic fields generated by the motor drive coils 64 until the total magnetic field of the motor 10 at a distance from the motor 10 is minimized. As provided herein, the control system 15 can include a resistive shunt that adjusts the current to the auxiliary conductor array 42.

In the embodiment illustrated in FIGS. 3A and 3B, the control system 15 directs current in series through the auxiliary coils 66 and the motor drive coils 64. As a result of this design, the auxiliary conductor array 42 does not require any magnetic field sensor, controllers, or independent current drives. Thus, the auxiliary coils 66 are considered to be "passive" because no magnetic field sensors, controllers, or independent current drives are required for the auxiliary coils 66. Therefore, once the resistive shunt is set up and calibrated, the resistive shunt does not need to be changed. A separate resistive shunt may be provided for each phase.

For the design illustrated in FIGS. 3A and 3B, Equation 6 provides roughly $N_c I_c \approx 1/20NI$. If N=88 for the motor drive coil 64, the auxiliary coil 66 having approximately 4 turns, and all current from the motor drive coil 64 shunted through the auxiliary coil(s) 66 (i.e. $I=I_c$), should provide close to the canceling condition. Experimentally, using an auxiliary coil 66 having six turns, and about 70% of the current passed through the auxiliary coil 66, leads to $N_c I_c \approx 4I$.

As provided above, the auxiliary conductor array 42 does not produce any significant force on the motor 10. Further, the auxiliary conductor array 42 is not believed to significantly influence the total inductance of the motor 10. More specifically, the inductance from the auxiliary conductor array 42 will be approximately proportional to $2npL_c N_c^2$. The inductance of the motor drive coils 64 will be roughly proportional to (no. poles)×(pole area)×$N^2$. With this in mind, it is expected that the additional inductance caused by the auxiliary coils 66 will be only a few percent of the inductance of the motor drive coils 64. Because the fields of the motor drive coils 64 and the auxiliary coils 66 overlap and are predominantly out of phase, the total inductance (mutual plus self) is believed to be somewhat less than the inductance of the motor drive coils 64. Thus, the dynamic performance of the motor 10 is essentially not influenced by the auxiliary coils 66.

FIG. 3C is a side view of an eight pole motor drive conductor array 40 and the auxiliary conductor array 42 positioned in front of a position of the first magnet array 50. Importantly, in this design, the left transverse segment 68C and the right transverse segment 68D are again positioned to lie in the magnetic fields of the same polarity of the magnet arrays 36. From Equation 2, a motor drive with an even number of poles would not be expected to generate a dipole magnetic field. However, errors in coil windings may leave a weak residual dipole field.

FIGS. 4A and 4B illustrate a second embodiment of the auxiliary conductor array 42. More specifically, FIG. 4A illustrates a perspective view of the second embodiment of the auxiliary conductor array 42 in the conductor component 14, and FIG. 4B illustrates a side view of the auxiliary conductor array 42 positioned in front of a portion of the first magnet array 50.

In this embodiment, the auxiliary conductor array 42 includes (i) an upper longitudinal coil set 70A extending substantially parallel to the upper longitudinal edge 62A of the conductor section 60, (ii) a lower longitudinal coil set 70B extending substantially parallel to the lower longitudinal edge 62B of the conductor section 60, (iii) a left transverse coil set 70C extending substantially parallel to the left transverse edge 62C of the conductor section 60, and (iv) a right transverse coil set 70D extending substantially parallel to the right transverse edge 62D of the conductor section 60. The coil sets 70A, 70B, 70C, 70D are positioned around the motor drive conductor array 40 and cooperate to substantially encircle the motor drive conductor array 40 in its plane. Stated another way, the coil sets 70A, 70B, 70C, 70D are positioned around the perimeter of the conductor section 60 of the conductor component housing 38 and are positioned symmetrically with respect to the axis of symmetry of the motor drive coil 40.

In this embodiment, each of coil sets 70A, 70B, 70C, 70D includes three separate auxiliary coils 66. Each of the auxiliary coils 66, in each of the coil sets 70A, 70B, 70C, 70D is designed to cancel the stray magnetic field generated by one of the phases of the motor drive conductor array 40. The auxiliary coils 66 in each of the coil sets 70A, 70B, 70C, 70D are staggered similar to the motor drive coils and spaced apart along the conductor component housing 38 to cancel the stray magnetic field generated by each of the phases of the motor drive conductor array 40. The auxiliary coils 66 are illustrated as being vertically offset for clarity.

The control system 15 again controls current to the auxiliary conductor array 42 to reduce and/or effectively cancel the stray magnetic fields generated by the motor 10. The embodiment illustrated in FIGS. 4A and 4B can be used in several ways. If control system 15 drives (i) the same magnitude current in the same direction through longitudinal coil sets 70A and 70B, and (ii) the same magnitude current in the same direction through transverse coil sets 70C and 70D, primarily magnetic dipole fields are generated by the auxiliary conductor array 42 at a distance from the motor 10. The primarily magnetic dipole fields may approximate the magnitude of the stray magnetic field from the motor drive conductor array 40 more accurately than the magnetic field from the embodiment illustrated in FIGS. 3A, 3B and described above. Provided the dimensions of the coils satisfy the assumptions underlying Equations 1–6, no net force on the motor drive conductor array 40 will occur.

However, in the embodiment illustrated in FIGS. 4A and 4B, if control system 15 drives (i) the same magnitude current in opposite directions through the longitudinal coil sets 70A and 70B, and (ii) the same magnitude current in opposite directions through the transverse coil sets 70C and 70D, primarily magnetic quadrupole fields are generated at a distance from the motor.

In some situations other combinations may prove to be beneficial. For example, coil sets 70A and 70B may require the same current in the same direction, while coil sets 70C and 70D may require the same current in opposite directions, or vice versa.

Importantly, the vertical centerlines of each of the transverse coil sets 70C, 70D should be separated by an exact number of pole pitches to ensure that substantially no drive force is generated by the current flowing in the auxiliary coils. Again, once the resistive shunt is set up and calibrated, the resistive shunt does not need to be changed.

The geometries of the auxiliary coils 66 illustrated in FIGS. 4A and 4B allow the auxiliary conductor array 42 to be positioned within the vertical limits of the motor drive conductor array 40. However, if these auxiliary coils only need to be a few turns, maybe they could be positioned near the top and bottom surfaces of the motor drive conductor array 40. This would reduce the size of the auxiliary coils 66 and provide better cancellation of the stray magnetic fields.

In the embodiment illustrated in FIGS. 4A and 4B, each phase of the motor drive conductor array 40 includes eight motor drive coils 64, an even number of electric poles. From Equation 2, with an even number of turns, the motor drive conductor array 40 is not expected to generate a significant net dipole field. Instead, the dominant stray field at a distance from the motor drive conductor array 40 Is expected to be a magnetic quadrupole field. Thus, the auxiliary conductor array 42 must produce a quadrupole field to cancel the quadrupole field generated by the motor drive conductor array 40.

As provided herein, quadrupole fields can be produced using an auxiliary conductor array 42 constructed from pairs of opposing dipoles. FIGS. 4A and 4B illustrate an auxiliary conductor array 42 that produces a quadrupole field. The embodiment illustrated in FIGS. 4A and 4B can be combined with the embodiment illustrated in FIGS. 3A and 3B to reduce and/or cancel both dipole and quadrupole fields.

Figure 5B:
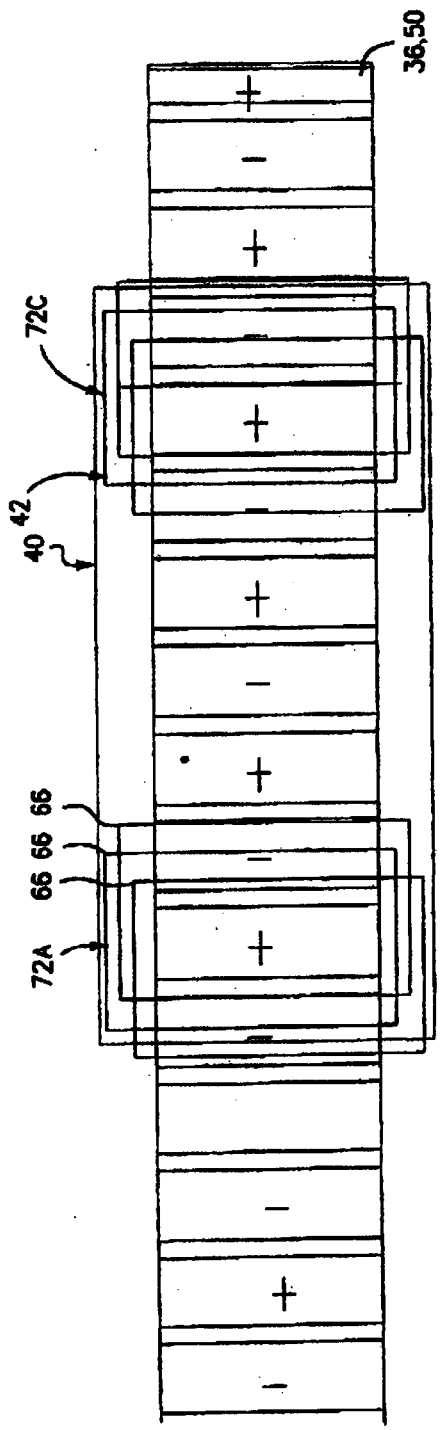
FIG. 5B is a side view of the motor drive conductor array and the auxiliary conductor array of FIG. 5A positioned in front of a portion of the first magnet array.

FIGS. 5A and 5B illustrate a third embodiment of the auxiliary conductor array 42. More specifically, FIG. 5A illustrates a perspective view of the third embodiment of the auxiliary conductor array 42 in the conductor component 14, and FIG. 5B illustrates a side view of the auxiliary conductor array 42 positioned in front of a portion of the first magnet array 50. It should be noted that the motor drive conductor array 40 is illustrated as a rectangular box in FIGS. 5A and 5B for clarity.

In this embodiment, the auxiliary conductor array 42 includes (i) a front left coil set 72A whose center coincides with the center of the end drive coil 64 nearest the left transverse edge 62C and which lies on the front side 62E of the conductor section 60, (ii) a rear left coil set 72B whose center coincides with the center of the end drive coil 64 nearest the left transverse edge 62C and which lies on the rear side 62F of the conductor section 60, (iii) a front right coil set 72C whose center coincides with the center of the end drive coil 64 nearest the right transverse edge 62D and which lies on the front side 62E of the conductor section 60, and (iv) a rear right coil set 72D whose center coincides with the center of the end drive coil 64 nearest the right transverse edge 62D and which lies on the rear side 62F of the conductor section 60. The length of each auxiliary coil along the direction of linear motion is an even integer multiple of the magnet pitch. This ensures that the auxiliary conductor array 42 does not generate unbalanced forces.

In a variation to this embodiment, the length of the auxiliary coil sets 72A–72D can be an odd integer multiple of magnet pitch. In this case the individual coils will generally experience an unbalanced force. Assuming the motor drive conductor array 40 to be made up of Identical motor drive coils 64, this can be avoided by locating the left transverse coil sets 72A, 72B and the right transverse coil sets 72C, 72D symmetrically about the center line of the motor drive conductor array 40 and spacing the left transverse coil sets 72A, 72B and the right transverse coil sets 72C, 72D appropriately. For example, for a motor drive conductor array 40 with an odd number of poles, and with an unbalanced magnetic dipole field, the center to center spacing between the left transverse coil sets 72A, 72B and the right transverse coil sets 72C, 72D should be an odd number of magnet pitches. Alternately, for a motor drive conductor array 40 with an even number of poles, and with an unbalanced magnetic quadrupole field, the center to center spacing between the left transverse coil sets 72A, 72B and the right transverse coil sets 72C, 72D should be an even number of magnet pitches.

In this embodiment, each of coil sets 72A–72D includes three separate auxiliary coils 66. Each of the auxiliary coils 66, in each of the coil sets 72A–72D is designed to cancel the stray magnetic field generated by one of the phases of the motor drive conductor array 40. The auxiliary coils 66 in each of the coil sets 72A–72D are staggered similar to the motor drive coils and spaced apart along the conductor component housing 38 to cancel the stray magnetic field generated by each of the phases of the motor drive conductor array 40. The auxiliary coils 66 are illustrated as being vertically offset for clarity.

This embodiment may be used with a motor drive conductor array 40 with either an odd or an even number of drive coils 64. For the case of an even number of drive coils, the control system 15 directs current in one direction to the two left transverse coil sets 72A and 72B, and in the opposite direction to the two right transverse coil sets 72C and 72D. For the case of an odd number of drive coils, the control system 15 directs current in the same direction to all four coil sets 72A, 72B, 72C, and 72D. The control system 15 adjusts the current to the auxiliary conductor array 42 to reduce and/or effectively cancel the stray magnetic fields generated by the motor 10. Again, once the resistive shunt is set up and calibrated, the resistive shunt does not need to be changed.

The results from a test motor 10 having a 9-pole motor drive conductor array 40 and an auxiliary conductor array 42 are provided below. Data for a 10 pole motor drive conductor array 40 are also provided below. FIGS. 6A and 6B illustrate the coordinate system utilized for the graphs discussed below, relative to the magnet component 12. The data in FIGS. 7–16 represent the magnetic fields from a single phase of the motor drive conductor array 40 and the auxiliary conductor array 42.

Figure 7:
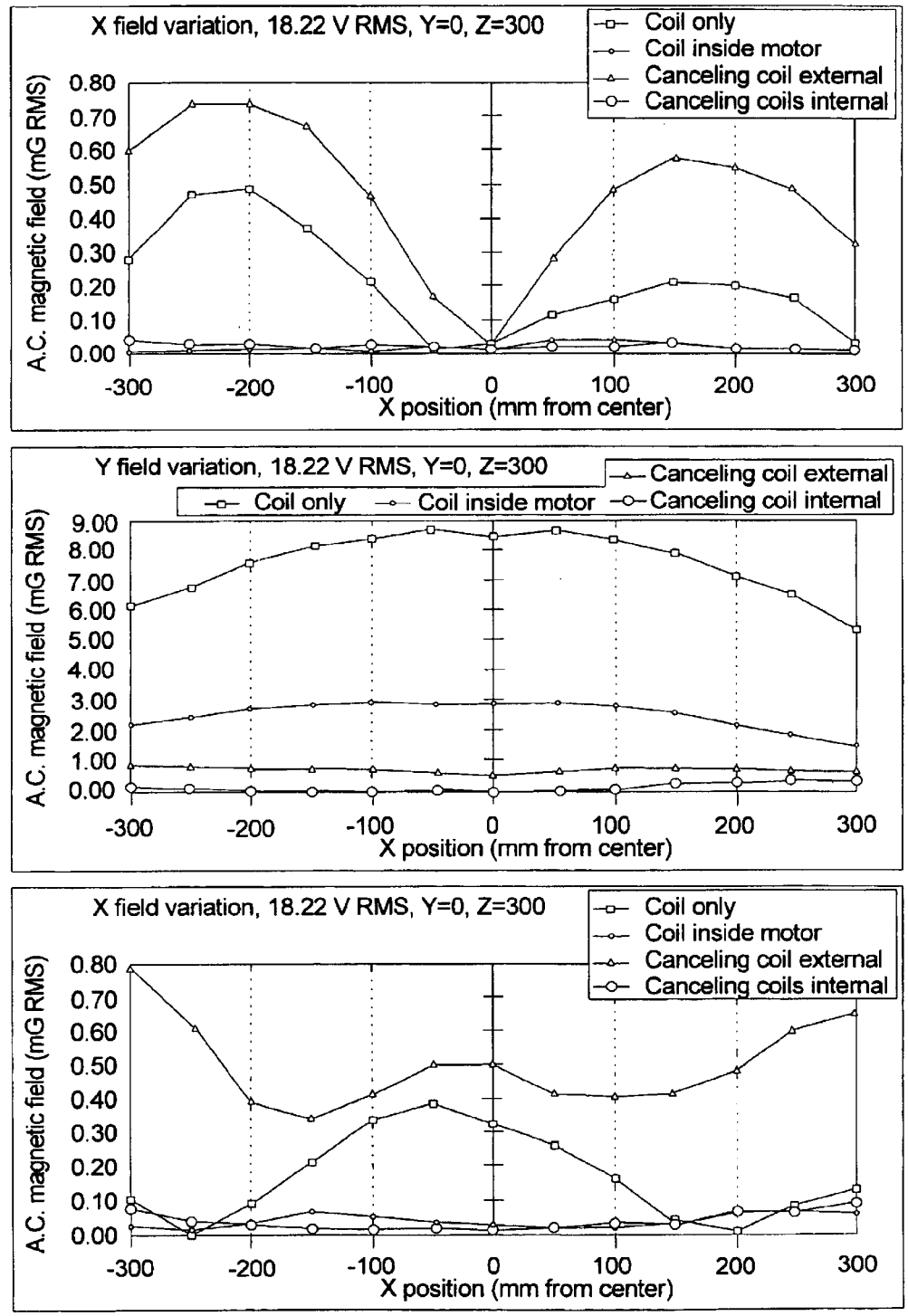
FIG. 7 provides three graphs that illustrate the influence of the auxiliary conductor array.

FIG. 7 includes three graphs that illustrate the influence of the auxiliary conductor array 42 for the three components of the magnetic field (B). FIG. 7 illustrates that the By component of the magnetic field of the motor drive conductor array 40 is the dominant one, and that the auxiliary conductor array 42 considerably cancels the magnetic field of the motor 10. For the test, a magnetic sensor (not shown) was located at X=0, Y=0, and Z=300 mm, and the current through the auxiliary conductor array 42 was adjusted by varying the shunt resistor of the control system 15, until the By component of the magnetic field of the motor drive conductor array 40 is minimized. FIG. 7 also illustrates the amount of magnetic shielding provided by the magnet component housing 34.

Cancellation of the other field components of the stray magnetic field was less successful in the test motor. However, the magnitude of the other field components is much smaller than the By component, Further, the auxiliary conductor array can include additional auxiliary coils, appropriately oriented, to reduce the Bx and Bz components further, without significantly influencing the larger By fields.

Figure 8:
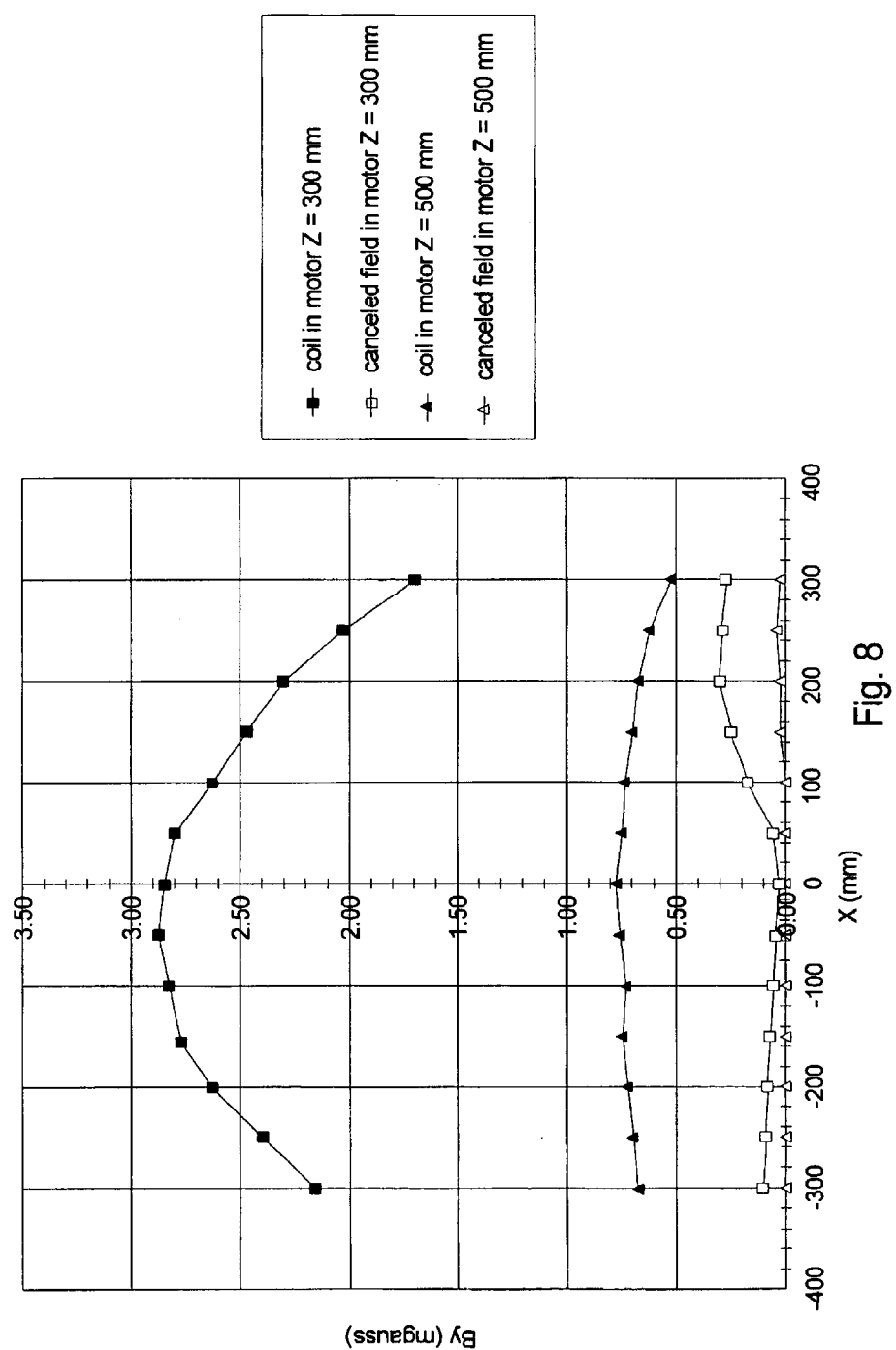
FIG. 8 is a graph that illustrates the cancellation of the stray magnetic field at several distances from the motor.

FIG. 8 illustrates the cancellation of the By component of the stray magnetic field at several distances from the test motor 10. In particular, FIG. 8 illustrates that the cancellation of the By component does not occur only at a unique distance from the motor 10. It also illustrates that the above analysis, leading to Equations 1–6, is valid for distances from the motor greater than no more than 300 mm.

Figure 9:
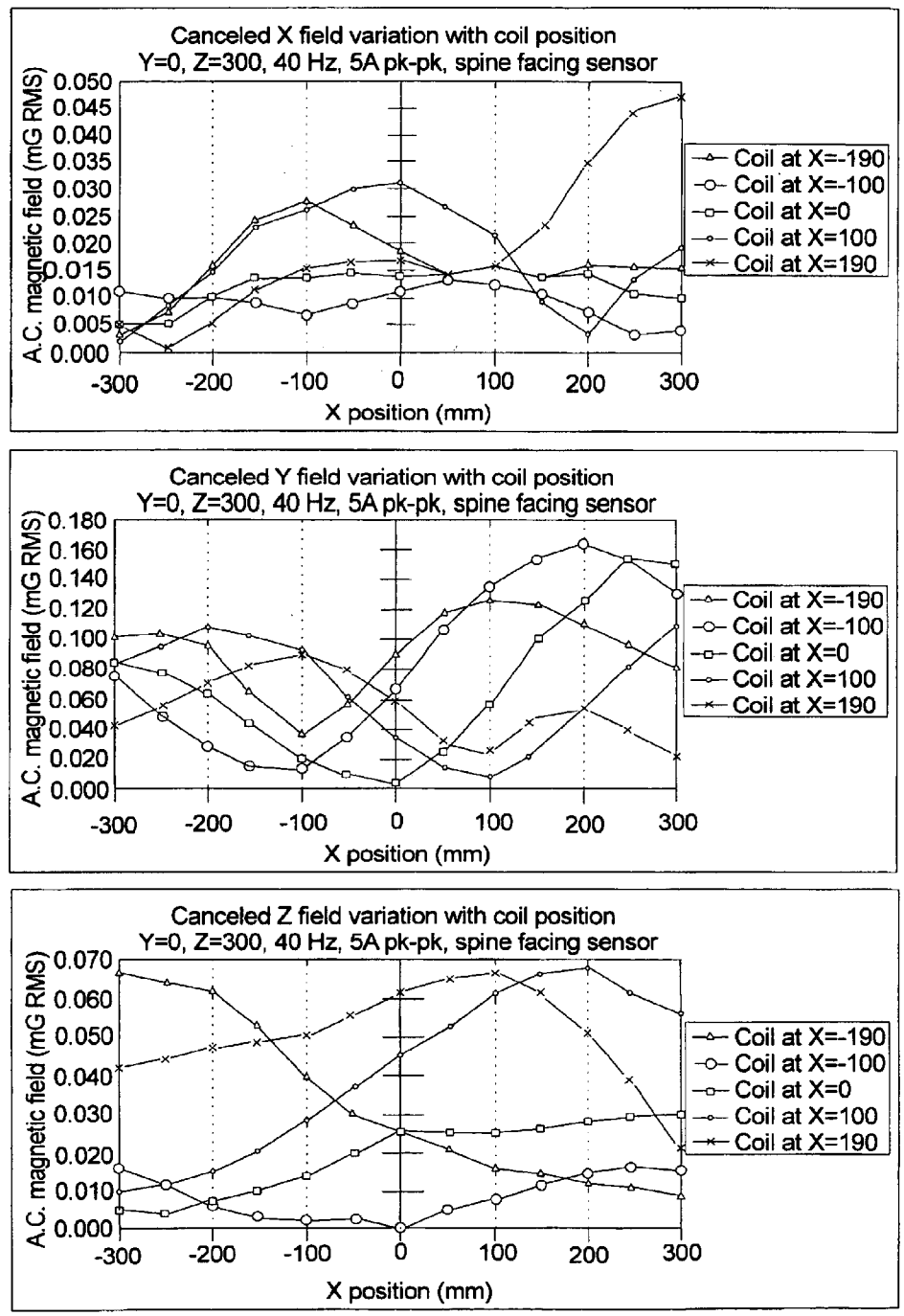
FIG. 9 provides three graphs that illustrate resultant magnetic fields.

FIG. 9 includes three graphs that illustrate the resultant magnetic fields with the motor drive conductor array coil 40 moved to different locations relative to the magnet component 12. While there is some dependence upon the location of the motor drive conductor array coil 40, the cancellation of the stray magnetic field by the auxiliary conductor array 42 is not significantly influenced.

Figure 10:
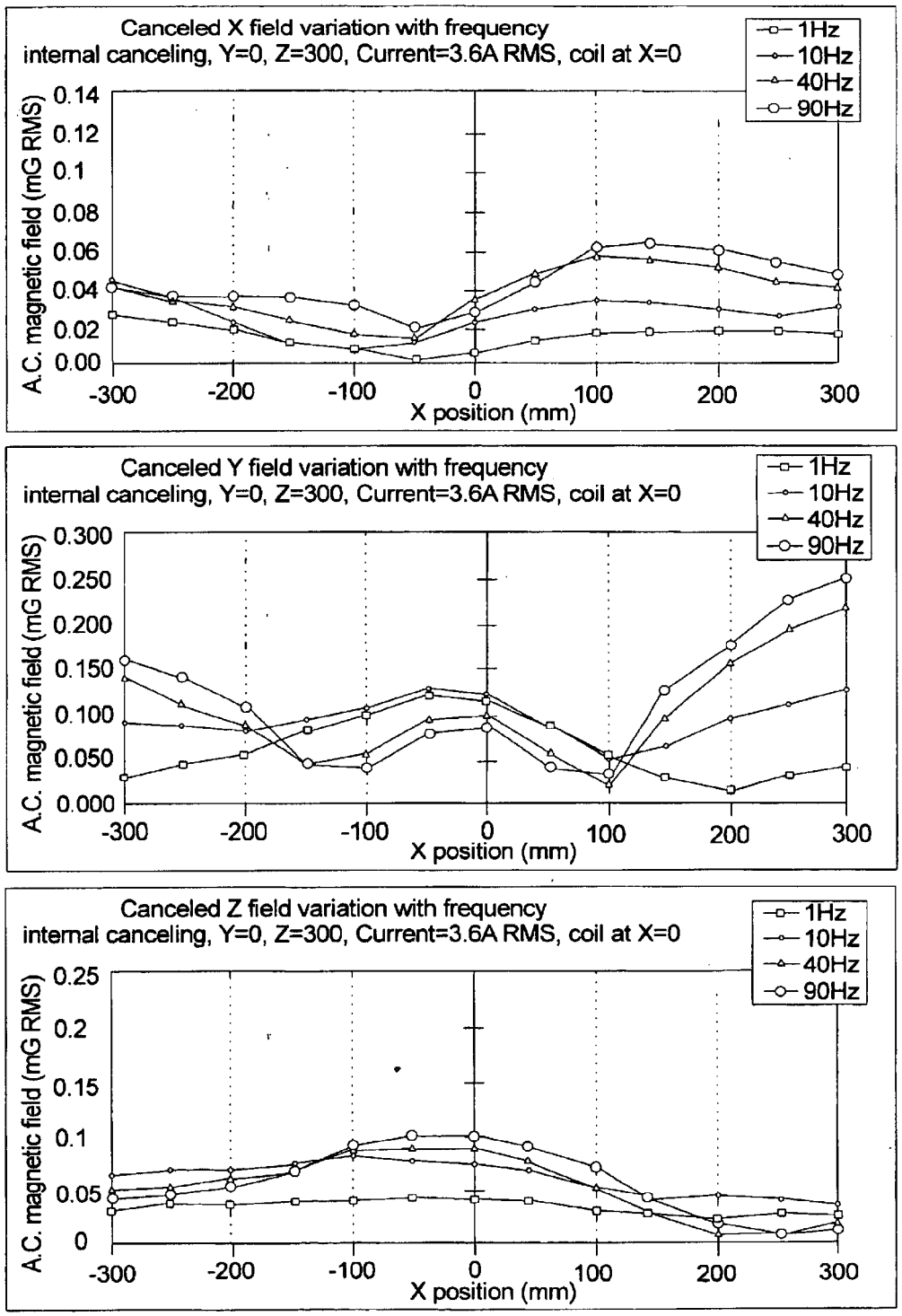
FIG. 10 provides three graphs that illustrate how cancellation is influenced by frequency.

FIG. 10 includes three graphs that illustrate that the cancellation of the stray magnetic field by the auxiliary conductor array 42 can depend upon the frequency of the current that is directed through the conductor arrays 40, 42. FIG. 10 highlights that cancellation by the auxiliary conductor array 42 is a little worse at higher frequencies than at lower frequencies. This is believed to be caused by the excitation of eddy currents in the magnet component housing 34.

As provided above, a motor 10 having a motor drive conductor array 40 with an even number of poles is expected to have a lower magnitude stray magnetic field, as far as magnetic dipole contributions are concerned than a motor 10 having a motor drive conductor array 40 with an odd number of poles.

Figure 11:
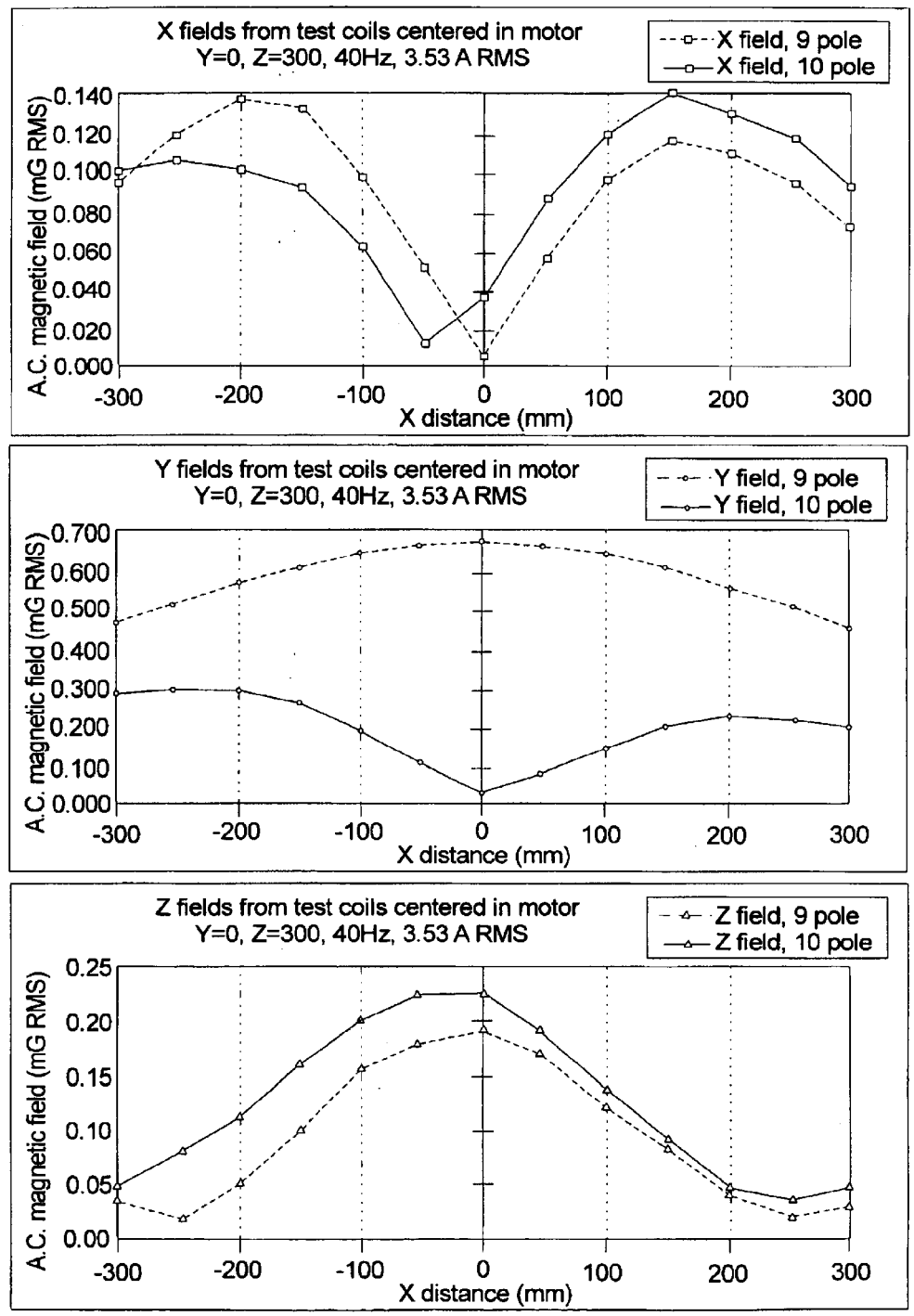
FIG. 11 provides three graphs that compare a nine pole motor with a ten pole motor.

Additionally, the stray magnetic field for a test motor having a nine (9) pole motor drive conductor array was compared with the stray magnetic field for a test motor having ten (10) pole drive conductor array. The results are illustrated in three graphs in FIG. 11. More specifically, FIG. 11 illustrates that the By component is much lower for the motor having the 10-pole motor drive conductor array than the motor having the 9pole motor drive conductor array. This is believed to reflect the absence of the unbalanced magnetic dipole in the 9 pole motor drive conductor array.

Figure 12:
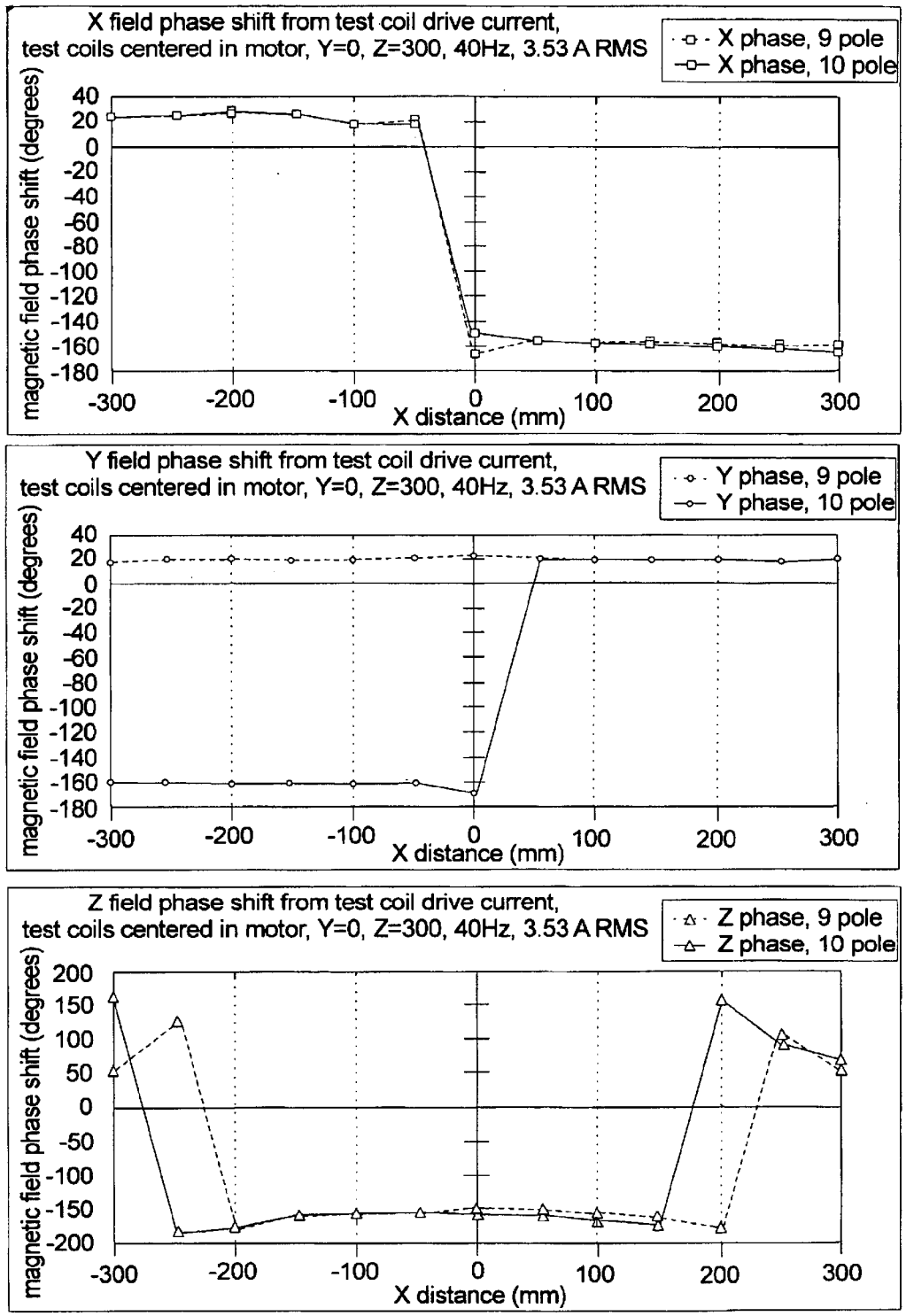
FIG. 12 provides three graphs that illustrate the phase of the magnetic fields as a function of position.

FIG. 12 illustrates the phase of the magnetic fields as a function of position. The 180 degree phase shift for the By component at X≈0 is what would be expected if the By component is predominantly a quadrupole magnetic field.

Figure 13:
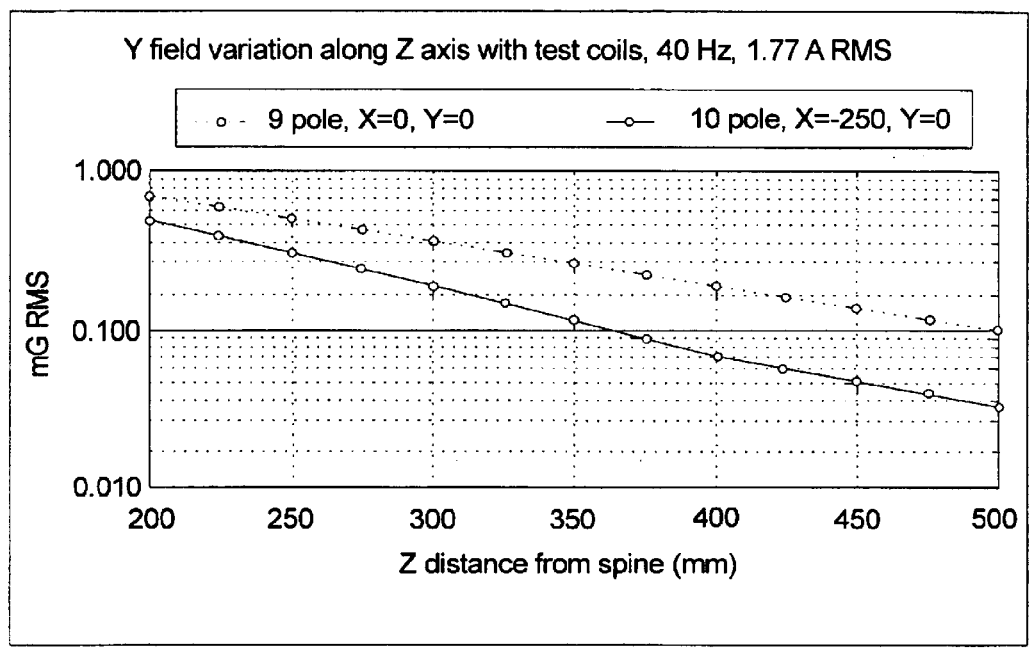
FIG. 13 is a graph that illustrates the field variation of the stray magnetic field along the Z axis.

FIG. 13 illustrates the field variation of the By component of the stray magnetic field along the Z axis for a motor having a ten (10) pole motor drive conductor array. The relatively faster falloff in By component for the 10-pole field is consistent with the interpretation that it is predominantly a quadrupole field.

An analysis of the theoretical shape of the motor drive conductor array and the auxiliary conductor array was performed. The coil of interest was assumed to be made up of point magnetic field sources spread out at equal intervals along the Z=0 line on a pitch of 8.5 mm (¼of the pole pitch). An inverse square law for field strength was assumed, and the aggregate effect of all the point sources was calculated along the Z=300 line. This is equivalent to representing the magnetic field from the coil by an assembly of magnetic charges. The point source polarity was changed at 34 mm intervals for the 9 pole coil, and kept constant for the canceling coil.

Figure 14:
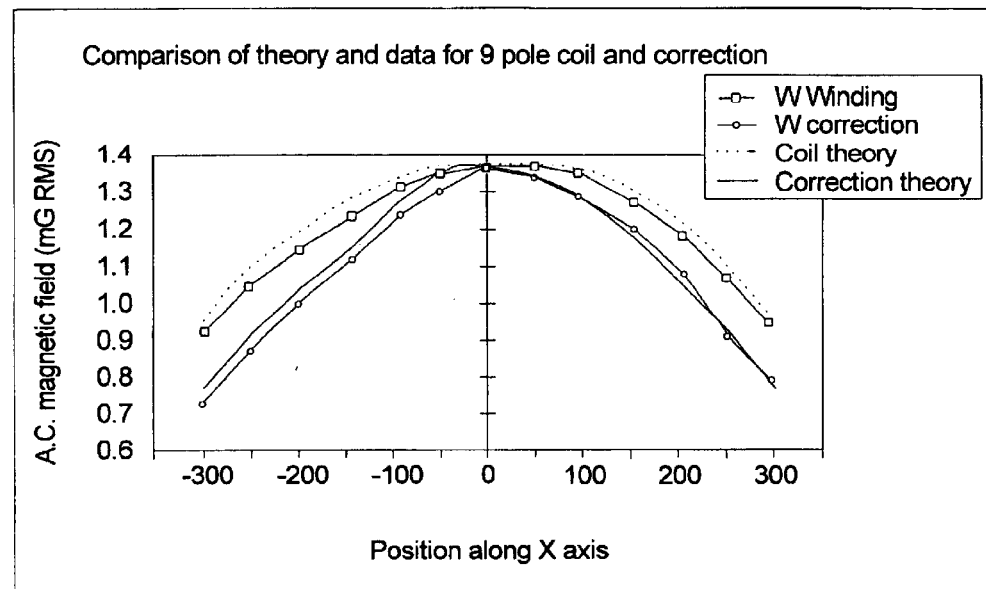
FIG. 14 is a graph that illustrates theoretical curves for a 9 pole coil.

The theoretical curves generated by this simple model were fitted to the measured data at X=0 and compared with the shape of the measured curves and a good match was found as can be seen from the graph in FIG. 14. It is observed that the shapes of the motor drive coil ("w winding") field and the canceling coil ("w correction") field do not match, with the canceling coil fields falling off more steeply along the Z=300 line on either side of X=0. The difference between the two curves accounts for the rise in the cancelled field on either side of X=0.

The theory was further developed to model a 10 pole coil and a quadrupole auxiliary conductor array. The quadrupole auxiliary conductor array was assumed to consist of two coils of length 136 mm, with opposite polarity and separated by 68 mm. This configuration produces approximately no net force from the auxiliary coils when operated in the magnet arrays.

Figure 15:
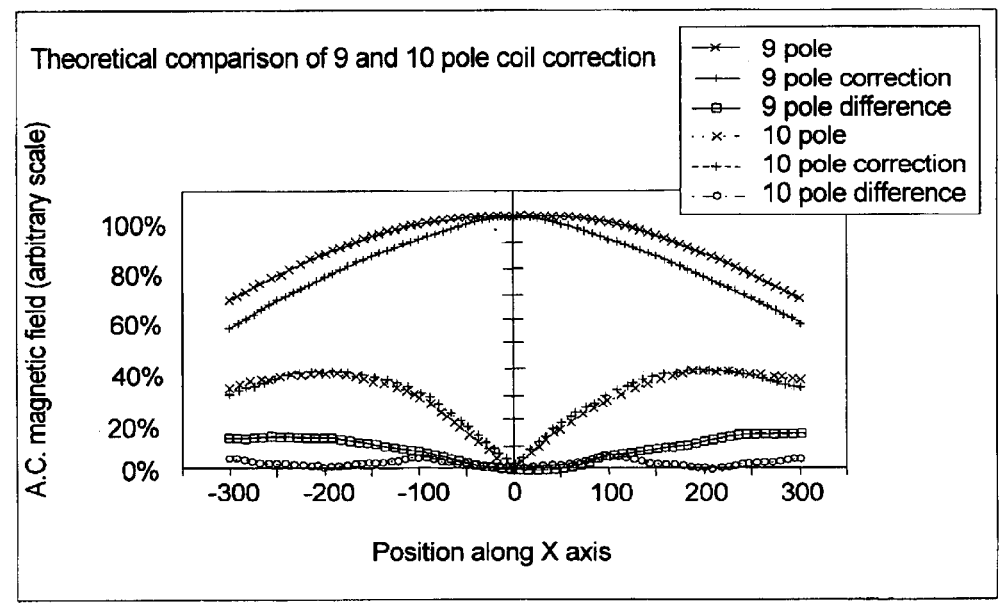
FIG. 15 is a graph that illustrates theoretical curves for 9 pole and 10 pole coils.

Comparisons of the 9 and to 10 pole theoretical fields are illustrated in FIG. 15. The first difference to be observed is that the 10 pole motor drive coil has a peak field of 38% of the 9 pole peak field. Compared with the 9 pole motor drive coil and the auxiliary coil, the quadrupole auxiliary conductor array field matches the 10 pole motor drive coil field much better. The peak corrected magnetic field for the 9 pole motor drive coil system is 12.7% of the peak uncorrected magnetic field, whereas the peak corrected field for the 10 pole motor drive coil system is only 2.9% of the peak uncorrected magnetic field.

Figure 16:
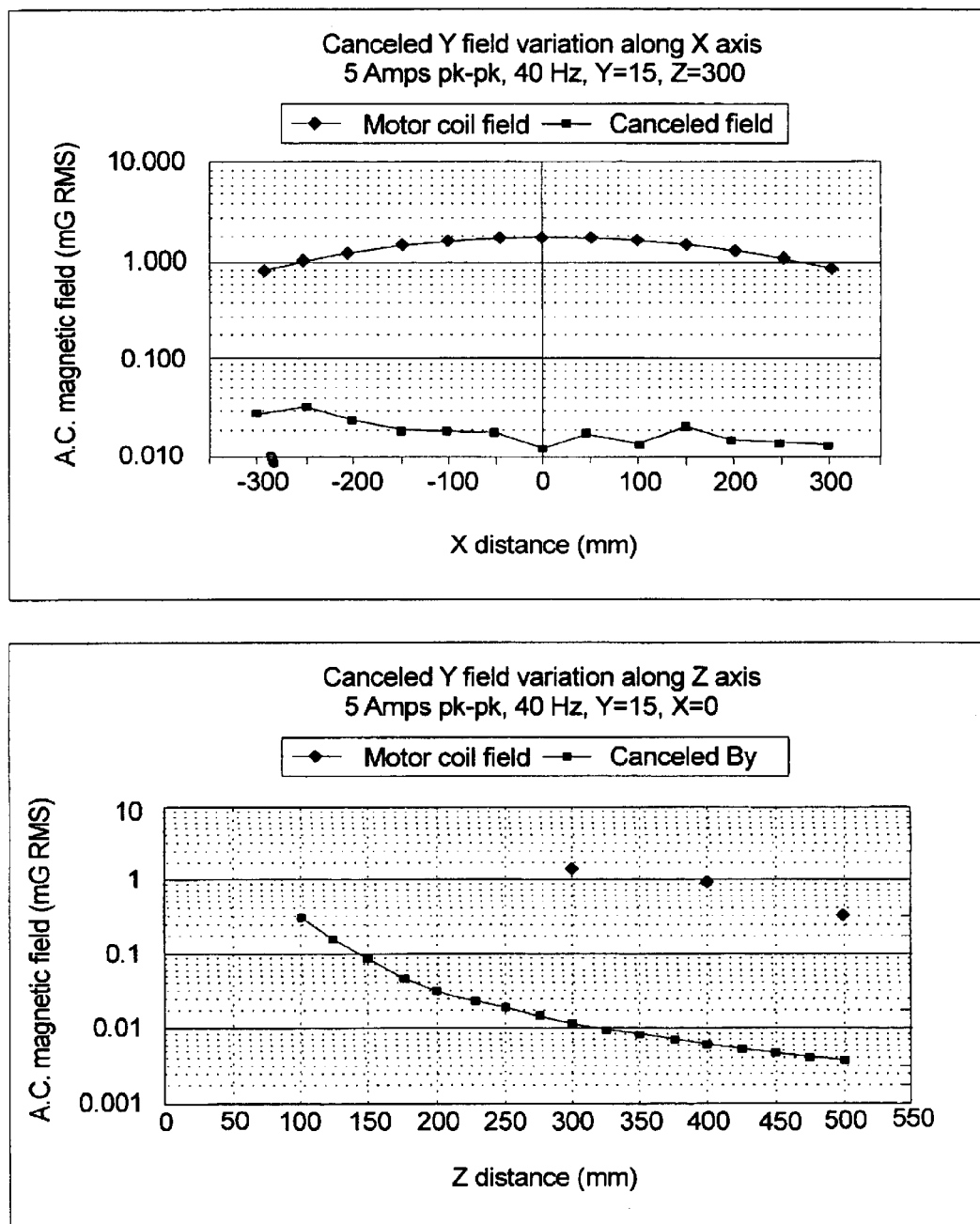
FIG. 16 is a graph showing performance of a version of the third embodiment for a 9-pole motor drive coil.

Compared with the peak uncorrected magnetic field of the 9 pole motor drive coil, the cancelled 10 pole motor drive system produces only 1.1% of the stray magnetic field. FIG. 16 shows experimental results from auxiliary coils designed according to the third embodiment for a 9-pole motor drive coil. The left and right auxiliary drive coil centers are symmetrically located and separated by 306 mm (nine magnet pitch units), and the length of the auxiliary coil along the direction of linear motion is one unit of the magnet pitch, 34 mm. For these conditions, no unbalanced forces occur. A reduction by approximately two orders of magnitude of the motor stray field is demonstrated. The cancellation is effective over an extended range in X and Z.

Further improvement might be achieved if the number of poles in the motor drive conductor array is set equal to a multiple of 4. The reasoning behind this is discussed below. A 9-pole motor drive coil can be represented by its magnetic polarity as follows:

9-pole motor drive coil: +-+-+-+-+
                   |    unbalanced dipole in the center of the array.

10-pole motor drive coil: +-+-+-+-+-
              + | -    a net + dipole on the left, a net-dipole on the right -> quadrupole moment.

However, for an 8-pole motor drive coil (=4×2):

8-pole motor drive coil: +-+-+-+-
                  |    there is symmetry on both sides of the coil center.

The lowest order moment at sufficient distance from the motor would then be expected to be an octupole, and the stray magnetic field will decrease quicker than that from a quadrupole moment.

In the above embodiments, a separate set of auxiliary coils are provided for each phase of the motor drive conductor array 40, because the coils of different phase are staggered in position. However, with possibly some loss of cancellation performance, a single set of auxiliary coils could be positioned within the range of positions of the different phase coil sets. The currents from the different phases could by electrically summed by the controller 15 and supplied to this single auxiliary coil set through a resistive shunt, set to obtain optimum cancellation. For some applications where simplicity and light weight of the motor drive conductor array 40 is paramount, the loss of some field cancellation efficiency may be an acceptable tradeoff.

In summary, the conductor component 14 provided herein reduces the magnitude of stray magnetic fields generated by the electric motor 10, without significantly influencing the dynamic performance of the motor 10 and without significantly increasing the size of the motor 10. The amount of reduction of the stray magnetic field will depend upon the design of the motor 10. As provided herein, a reduction of the By component of the stray AC magnetic field at a distance of 300 mm or greater can be greater than a factor of at least 10, and more preferably a factor of at least approximately 25, and even more preferably a factor of at least approximately 50 and still more preferably a factor of at least approximately 100. A reduction of a factor of approximately 100 leads to magnetic fields of the order of 20 microgauss for the experimental conditions described in FIGS. 7 and 8. The geometry of the present embodiment is such that cancellation of the By component of magnetic field is far more effective than cancellation of the Bx or Bz components. Nevertheless, the total residual stray magnetic fields, after cancellation, are approximately 20–30 microgauss, far smaller than originally.

Finally, the motor drive conductor array 40 is not perfectly planar. There may be some stray magnetic fields generated which might be correctable with auxiliary coils wound in the YZ plane or the XY plane, according to the coordinate system of FIGS. 6A and 6B.

FIG. 17 illustrates an exposure apparatus 18 that utilizes one or more motors 10 having features of the present invention. More specifically, FIG. 17 illustrates the exposure apparatus 18 including a reticle stage assembly 26 having two of the motors 10 and a wafer stage assembly 30 having two of the motors 10. In FIG. 17, the conductor components 14 of two of the motors 10 are secured to a reticle stage 100 and the conductor components 14 of two of the motors 10 are secured to a wafer stage 102. In this design, two of the motors 10 move the reticle stage 100 and two of the motors 10 move the wafer stage 102 in a direction normal to the plane of FIG. 17. In addition, other motors (not shown) may move the reticle or wafer stage in directions within the plane of the FIG.

Additionally, the exposure apparatus 18 includes a mounting frame 104, the optical assembly 28, the illumination system 24 (irradiation apparatus), a reticle enclosure 108, a wafer enclosure 110 and the control system 15. The exposure apparatus 10 is typically mounted to a mounting base 106. The mounting base 106 can be the ground, a base, or floor, or some other supporting structure.

The exposure apparatus 18 is particularly useful as a lithographic device that transfers a pattern (not shown) of an integrated circuit from the reticle 20 onto the semiconductor wafer 22.

The mounting frame 104 is rigid and supports the components of the exposure apparatus 18. The design of the mounting frame 104 can be varied to suit the design requirements for the rest of the exposure apparatus 18. The mounting frame 104 illustrated in FIG. 17, supports the reticle stage assembly 26, the wafer stage assembly 30, the optical assembly 28, and the illumination system 24 above the mounting base 106. Alternately, for example, separate, individual structures (not shown) can be used to support the stage assemblies 26, 30, the illumination system 24 and the optical assembly 28 above the mounting base 106.

The illumination system 24 includes an illumination source 32 and an illumination optical assembly 112. The illumination source 32 emits the irradiation. The illumination optical assembly 112 guides the irradiation from the illumination source 32 to the optical assembly 28. The beam Illuminates selectively different portions of the reticle 20 and exposes the wafer 22. In FIG. 17, the illumination source 24 is illustrated as being supported above the reticle stage 100. Typically, however, the illumination source 32 is secured to one of the sides of the mounting frame 104 and the irradiation from the illumination source 32 is directed to above the reticle stage 100 with the illumination optical assembly 112.

The optical assembly 28 projects and/or focuses the irradiation passing through reticle to the wafer. Depending upon the design of the apparatus 18, the optical assembly 28 can magnify or reduce the image created at the reticle. The above description of the exposure apparatus 18 has been general, as far as the nature of the irradiation used to expose wafers is concerned. The present invention is likely to be most useful when the irradiation consists of charged particles, such as electrons or ions. In that case the wafer enclosure 110 and reticle enclosure 108 are vacuum chambers that are attached to the illumination optical assembly 112 and the optical assembly 28 by hermetic seals. However, even in a photolithography system, where the irradiation consists of photons of any wavelength, certain sensor or other equipment associated with apparatus 18, may by sensitive to stray magnetic fields. In that case the present invention may be applied with profit to these systems as well.

The reticle stage 100 holds and precisely positions the reticle 20 relative to the optical assembly 28 and the wafer 22. Somewhat similarly, the wafer stage 102 holds and positions the wafer 22 with respect to the projected image of the illuminated portions of the reticle 20. In the embodiment illustrated in FIG. 17, the wafer stage 102 and the reticle stage 100 are positioned by brushless electric motors 10 having features of the present invention.

Additionally, the present invention provided herein can be used in other devices, including other semiconductor processing equipment, elevators, electric razors, machine tools, metal cutting machines, inspection machines and disk drives.

While the particular conductor component 14 and motor 10 as herein shown and disclosed in detail are fully capable of obtaining the objects and providing the advantages herein before stated, it is to be understood that they are merely illustrative of embodiments of the invention and that no limitations are intended to the details of construction or design herein shown other than as described in the appended claims. Additional variations to the motor 10 are possible. For example, shields (not shown) made of magnetically permeable material can be positioned near the motor to further block stray magnetic fields.

What is claimed is:

1. A conductor component for a motor, the motor including a magnet component, the magnet component including a magnet that is surrounded by a magnetic field, the conductor component comprising:

a motor drive conductor array that moves relative to the magnet component and generates a drive magnetic field and a stray magnetic field when electrical current is directed through the motor drive conductor array, the drive magnetic field interacting with the magnetic field of the magnet to generate a reactive force; and an auxiliary conductor array that moves concurrently with the motor drive conductor array relative to the magnet component and generates an auxiliary magnetic field that interacts with the stray magnetic field and reduces the stray magnetic field.

2. The conductor component of claim 1 wherein the auxiliary conductor array generates the auxiliary magnetic field when electrical current is directed through the auxiliary conductor array.

3. The conductor component of claim 1 wherein the auxiliary magnetic field has substantially no influence on the position of the conductor component relative to the magnet component.

4. The conductor component of claim 1 wherein the auxiliary conductor array substantially encircles the motor drive conductor array.

5. The conductor component of claim 4 wherein the auxiliary conductor array includes a plurality of auxiliary coils that each encircle the perimeter of the motor drive conductor array.

6. The conductor component of claim 4 wherein the motor drive conductor array includes an odd number of poles.

7. The conductor component of claim 4 wherein the auxiliary conductor array includes a left transverse segment and a right transverse segment that is spaced apart from the left transverse segment, wherein when a current is directed through the auxiliary conductor array, the left transverse segment generates a force that is substantially equal and opposite to a force generated by the right transverse segment.

8. The conductor component of claim 1 wherein the auxiliary conductor array includes a pair of spaced apart auxiliary coil sets.

9. The conductor component of claim 1 wherein the auxiliary conductor array includes an upper longitudinal coil set, a lower longitudinal coil set, a left transverse coil set and a right transverse coil set that cooperate to substantially encircle the perimeter of the motor drive conductor array.

10. The conductor component of claim 9 wherein the motor drive conductor array includes an even number of poles.

11. The conductor component of claim 1 wherein the auxiliary conductor array includes a left transverse coil set and a right transverse coil set and wherein when a current is directed through the left transverse coil set and the right transverse coil set, the left transverse coil set generates a force that is substantially equal and opposite to a force generated by the right transverse coil set.

12. The conductor component of claim 1 further comprising a conductor housing that retains the motor drive conductor array and the auxiliary conductor array.

13. The conductor component of claim 12 wherein the conductor housing includes a conductor section that retains the motor drive conductor array and the auxiliary conductor array.

14. The conductor component of claim 1 wherein the auxiliary conductor array reduces the stray magnetic field a factor of at least approximately 100.

15. A linear motor including the conductor component of claim 1 and a magnet component including a magnet that is surrounded by a magnetic field.

16. The linear motor of claim 15 wherein the magnet component includes a pair of spaced apart magnet arrays and the motor drive conductor component is positioned between the magnet arrays.

17. The linear motor of claim 16 wherein the auxiliary conductor component is positioned between the magnet arrays.

18. A stage assembly including the linear motor of claim 15.

19. An exposure apparatus including the linear motor of claim 15.

20. An object on which an image has been formed by the exposure apparatus of claim 19.

21. A semiconductor wafer on which an image has been formed by the exposure apparatus of claim 19.

22. The exposure apparatus of claim 19 including an illumination source that generates an electronic beam.

23. An exposure apparatus comprising a brushless electric motor, the brushless electric motor comprising:
   a magnet component including a plurality of magnets, each of the magnets being surrounded by a magnetic field;
   a conductor component that includes a motor drive conductor array, the motor drive conductor array generating a drive magnetic field and a stray magnetic field when electrical current is directed through the motor drive conductor array, the drive magnetic field interacting with the magnetic fields of the magnets to generate a reactive force that is used to move one of the components relative to the other component; and
   an auxiliary conductor array that generates an auxiliary magnetic field that interacts with the stray magnetic field and reduces the stray magnetic field.

24. The exposure apparatus of claim 23 wherein the auxiliary conductor array generates the auxiliary magnetic field when electrical current is directed through the auxiliary conductor array.

25. The exposure apparatus of claim 23 wherein the auxiliary magnetic field has substantially no influence on the position of the conductor component relative to the magnet component.

26. The exposure apparatus of claim 23 wherein the auxiliary conductor array substantially encircles the motor drive conductor array.

27. The exposure apparatus of claim 26 wherein the auxiliary conductor array includes a plurality of auxiliary coils that each encircle the motor drive conductor array.

28. The exposure apparatus of claim 26 wherein the motor drive conductor array includes an odd number of poles.

29. The exposure apparatus of claim 26 wherein the auxiliary conductor array includes a left transverse segment and a right transverse segment that is spaced apart from the left transverse segment, wherein when a current is directed through the auxiliary conductor array, the left transverse segment generates a force that is substantially equal and opposite to a force generated by the right transverse segment.

30. The exposure apparatus of claim 23 wherein the auxiliary conductor array includes a pair of spaced apart auxiliary coil sets.

31. The exposure apparatus of claim 23 wherein the auxiliary conductor array includes an upper longitudinal coil set, a lower longitudinal coil set, a left transverse coil set and a right transverse coil set that cooperate to substantially encircle the motor drive conductor array.

32. The exposure apparatus of claim 31 wherein the motor drive conductor array includes an even number of poles.

33. The exposure apparatus of claim 23 wherein the auxiliary conductor array includes a left transverse coil set and a right transverse coil set and wherein when a current is directed through the left transverse coil set and the right transverse coil set, the left transverse coil set generates a force that is substantially equal and opposite to a force generated by the right transverse coil set.

34. The exposure apparatus of claim 23 wherein the conductor component includes a conductor housing that retains the motor drive conductor array and the auxiliary conductor array positioned near the motor drive conductor array.

35. The exposure apparatus of claim 34 wherein the conductor housing includes a conductor section that retains the motor drive conductor array and the auxiliary conductor array.

36. The exposure apparatus of claim 23 wherein the auxiliary conductor array reduces the stray magnetic field a factor of at least approximately 100.

37. The exposure apparatus of claim 23 wherein the magnet component includes a pair of spaced apart magnet arrays and the motor drive conductor component is positioned between the magnet arrays.

38. The exposure apparatus of claim 37 wherein the auxiliary conductor component is positioned between the magnet arrays.

39. The exposure apparatus of claim 23 further comprising a stage that is moved by the motor.

40. The exposure apparatus of claim 23 wherein the motor drive conductor array and the auxiliary conductor array move concurrently relative to the magnet component.

41. An object on which an image has been formed by the exposure apparatus of claim 23.

42. A semiconductor wafer on which an image has been formed by the exposure apparatus of claim 23.

43. The exposure apparatus of claim 23 including an illumination source that generates an electronic beam.

44. A method for manufacturing a brushless electric motor, the method comprising the steps of:
   providing a magnet component including a plurality of magnets, each of the magnets being surrounded by a magnetic field;
   providing a conductor component that includes a motor drive conductor array, the motor drive conductor array moving relative to the magnet component and generating a drive magnetic field and a stray magnetic field when electrical current is directed through the motor drive conductor array, the drive magnetic field interacting with the magnetic fields of the magnets to generate a reactive force that is used to move one of the components relative to the other component; and
   providing an auxiliary conductor array that moves concurrently with the motor drive conductor array relative to the magnet component and generates an auxiliary magnetic field that interacts with the stray magnetic field and reduces the stray magnetic field.

45. The method of claim 44 wherein the step of providing an auxiliary conductor array that generates an auxiliary magnetic field includes the step of directing electrical current through the auxiliary conductor array.

46. The method of claim 44 wherein the step of providing an auxiliary conductor array includes providing an auxiliary conductor array that substantially encircles the motor drive conductor array.

47. The method of claim 44 wherein the step of providing an auxiliary conductor array includes providing an auxiliary coil that includes a left transverse segment and a right transverse segment that is spaced apart from the left transverse segment, wherein when a current is directed through the auxiliary conductor array, the left transverse segment generates a force that is substantially equal and opposite to a force generated by the right transverse segment.

48. The method of claim 44 wherein the step of providing an auxiliary conductor array includes providing a pair of spaced apart auxiliary coil sets.

49. The method of claim 44 wherein the step of providing an auxiliary conductor array includes providing an upper longitudinal coil set, a lower longitudinal coil set, a left transverse coil set and a right transverse coil set that cooperate to substantially encircle the motor drive conductor array.

50. The method of claim 44 wherein the step of providing an auxiliary conductor array includes providing a left transverse coil set and a right transverse coil set and wherein when a current is directed through the left transverse coil set and the right transverse coil set, the left transverse coil set generates a force that is substantially equal and opposite to a force generated by the right transverse coil set.

51. The method of claim 44 wherein the step of providing the conductor component includes the step of providing a conductor housing that retains the motor drive conductor array and the auxiliary conductor array positioned near the motor drive conductor array.

52. The method of claim 44 wherein the step of providing a magnet component includes providing a pair of spaced apart magnet arrays and the motor drive conductor component is positioned between the magnet arrays.

53. The method of claim 52 including the step of positioning the auxiliary conductor component between the magnet arrays.

54. A method for manufacturing a stage assembly that moves a stage, the method comprising the steps of providing a motor manufactured by the method of claim 44 and connecting the motor to the stage.

55. A method for making an exposure apparatus that forms an image formed on a first object on a second object, the method comprising the steps of:
   providing an illumination system that illuminates the first object supported by a first stage to form the image on the second object; and
   connecting the motor manufactured by the method of claim 44 to the first stage as a driving force for moving the first object.

56. A method for making a device utilizing the exposure apparatus made by the method of claim 55.

57. A method for making a semiconductor wafer utilizing the exposure apparatus made by the method of claim 55.

58. The method of claim 55 wherein the step of providing an illumination system includes the step of providing an illumination source that generates an electronic beam.

59. A conductor component for a motor, the motor including a magnet component, the magnet component including a magnet that is surrounded by a magnetic field, the conductor component comprising:
   a motor drive conductor array that generates a drive magnetic field and a stray magnetic field when electrical current is directed through the motor drive conductor array, the drive magnetic field interacting with the magnetic field of the magnet to generate a reactive force; and
   an auxiliary conductor array that generates an auxiliary magnetic field that interacts with the stray magnetic field and reduces the stray magnetic field, wherein the auxiliary conductor array substantially encircles the motor drive conductor array.

60. The conductor component of claim 59 wherein the auxiliary conductor array includes a plurality of auxiliary coils that each encircle the perimeter of the motor drive conductor array.

61. The conductor component of claim 59 wherein the motor drive conductor array includes an odd number of poles.

62. The conductor component of claim 59 wherein the auxiliary conductor array includes a left transverse segment and a right transverse segment that is spaced apart from the left transverse segment, wherein when a current is directed through the auxiliary conductor array the left transverse segment generates a force that is substantially equal and opposite to a force generated by the right transverse segment.

63. The conductor component of claim 59 wherein the auxiliary conductor array includes an upper longitudinal coil set, a lower longitudinal coil set, a left transverse coil set and a right transverse coil set that cooperate to substantially encircle the perimeter of the motor drive conductor array.

64. The conductor component of claim 63 wherein the motor drive conductor array includes an even number of poles.

65. A conductor component for a motor, the motor including a magnet component, the magnet component including a magnet that is surrounded by a magnetic field, the conductor component comprising:
   a motor drive conductor array that generates a drive magnetic field and a stray magnetic field when electrical current is directed through the motor drive conductor array, the drive magnetic field interacting with the magnetic field of the magnet to generate a reactive force; and
   an auxiliary conductor array that generates an auxiliary magnetic field that interacts with the stray magnetic field and reduces the stray magnetic field, wherein the auxiliary conductor array includes a left transverse coil set and a right transverse coil set and wherein when a current is directed through the left transverse coil set and the right transverse coil set, the left transverse coil set generates a force that is substantially equal and opposite to a force generated by the right transverse coil set.

66. A conductor component for a motor, the motor including a magnet component, the magnet component including a magnet that is surrounded by a magnetic field, the conductor component comprising:
   a motor drive conductor array that generates a drive magnetic field and a stray magnetic field when electrical current is directed through the motor drive conductor array, the drive magnetic field interacting with the magnetic field of the magnet to generate a reactive force; and
   an auxiliary conductor array that generates an auxiliary magnetic field that interacts with the stray magnetic field and reduces the stray magnetic field by a factor of at least approximately 100.

67. A linear motor comprising:
   a magnet component including a pair of spaced apart magnet arrays, each of the magnet arrays being surrounded by a magnetic field; and
   a conductor component including: (i) a motor drive conductor array positioned between the magnet arrays that generates a drive magnetic field and a stray magnetic field when electrical current is directed through the motor drive conductor array, the drive magnetic field interacting with the magnetic field of the magnet to generate a reactive force; and (ii) an auxiliary conductor array that generates an auxiliary magnetic field that interacts with the stray magnetic field and reduces the stray magnetic field.

68. The linear motor of claim 67 wherein the auxiliary conductor component is positioned between the magnet arrays.

69. An exposure apparatus comprising:
   a linear motor including: a magnet component including a magnet that is surrounded by a magnetic field; and a conductor component including: (i) a motor drive conductor array that generates a drive magnetic field and a stray magnetic field when electrical current is directed through the motor drive conductor array, the drive magnetic field interacting with the magnetic field of the magnet to generate a reactive force; and (ii) an auxiliary conductor array that generates an auxiliary magnetic field that interacts with the stray magnetic field and reduces the stray magnetic field.

70. The exposure apparatus of claim 69 including an illumination source that generates an electronic beam.

71. A process for manufacturing a device including the steps of providing a substrate and transferring an image onto the substrate with the exposure apparatus according to claim 69.

72. A process for manufacturing a wafer including the steps of providing a substrate and transferring an image onto the substrate with the exposure apparatus of claim 69.

73. A conductor component for a motor, the motor including a magnet component, the magnet component including a magnet that is surrounded by a magnetic field, the conductor component comprising:

a motor drive conductor array that generates a drive magnetic field and a stray magnetic field when electrical current is directed through the motor drive conductor array, the drive magnetic field interacting with the magnetic field of the magnet to generate a reactive force; and an auxiliary conductor array that generates an auxiliary magnetic field that interacts with the stray magnetic field and reduces the stray magnetic field, wherein the auxiliary magnetic field has substantially no influence on the position of the conductor component relative to the magnet component.

74. A conductor component for a motor, the motor including a magnet component, the magnet component including a magnet that is surrounded by a magnetic field, the conductor component comprising:

a motor drive conductor array that generates a drive magnetic field and a stray magnetic field when electrical current is directed through the motor drive conductor array, the drive magnetic field interacting with the magnetic field of the magnet to generate a reactive force;

an auxiliary conductor array that generates an auxiliary magnetic field that interacts with the stray magnetic field and reduces the stray magnetic field; and a conductor housing that retains the motor drive conductor array and the auxiliary conductor array.

75. The conductor component of claim 74 wherein the conductor housing includes a conductor section that retains the motor drive conductor array and the auxiliary conductor array.

* * * * *